? United States Patent (10) Patent No.: US 8,898,026 B2
Howell et al. (45) Date of Patent: Nov. 25, 2014

(54) LIGHTING PERFORMANCE POWER MONITORING SYSTEM AND METHOD WITH OPTIONAL INTEGRATED LIGHT CONTROL

(75) Inventors: Donald W. Howell, Troutville, VA (US); Mark W. Vinson, Roanoke, VA (US); Frank O. Blevins, Salem, VA (US); Armand J. Tamagni, Jr., Troutville, VA (US); Michael L. Campbell, Roanoke, VA (US)

(73) Assignee: Admmicro Properties, L.L.C., Arlington, VA (US)

( * ) Notice: Subject to any disclaimer, the term of this patent is extended or adjusted under 35 U.S.C. 154(b) by 0 days.

(21) Appl. No.: 12/512,470

(22) Filed: Jul. 30, 2009

(65) Prior Publication Data

US 2009/0292403 A1 Nov. 26, 2009

Related U.S. Application Data

(63) Continuation of application No. 11/741,744, filed on Apr. 28, 2007, now Pat. No. 7,571,063.

(60) Provisional application No. 60/795,644, filed on Apr. 28, 2006.

(51) Int. Cl.
*G01R 21/00* (2006.01)
*G01R 21/06* (2006.01)
*G01R 22/10* (2006.01)
*G01R 19/25* (2006.01)

(52) U.S. Cl.
CPC ............ *G01R 22/10* (2013.01); *G01R 19/2513* (2013.01)
USPC .............................. 702/60; 315/131; 700/295

(58) Field of Classification Search
CPC .... Y02B 20/48; Y02B 20/46; Y02B 70/3225; Y02B 70/3283; Y02B 90/224; Y04S 20/246; H05B 37/034; G01R 19/2513; G01R 22/10; G05B 2219/2642
USPC ...................... 702/60; 700/295; 315/131, 312
See application file for complete search history.

(56) References Cited

U.S. PATENT DOCUMENTS 4,034,233 A 7/1977 Leyde
4,167,679 A 9/1979 Leyde et al.
(Continued)

FOREIGN PATENT DOCUMENTS

EP 0841605 5/1998
JP 2000059404 2/2000

OTHER PUBLICATIONS

Dencor Energy Control Systems, "Dencor Bill Reducer", pp. 1-5, [online], [retrieved on Apr. 22, 2004]. Retrieved from the Internet <URL: http://www.dencorinc.com/thebill.htm/>.

(Continued)

*Primary Examiner* — Janet Suglo
(74) *Attorney, Agent, or Firm* — Novak Druce Connolly Bove + Quigg LLP

(57) ABSTRACT

A light performance monitoring device and optionally integrated controller includes a monitor module that directly monitors energy usage of at least one energy load to generate at least one measurement of energy usage; a storage module stores a series of baseline values of energy usage of the energy load, a comparator module compares energy measurements made at predetermined intervals with the baseline values, and a notification module notifies a designated recipient that there is a deviation from the baseline values consistent with a burned out or non-operational light fixture, including but not limited to light bulbs or ballast devices. A control module optionally integrated with the light performance monitoring device can be operatively coupled to the monitor module to control energy usage by the at least one energy load via a data link in a predetermined manner that is based on the at least one measurement of energy usage.

14 Claims, 25 Drawing Sheets

(56) References Cited

U.S. PATENT DOCUMENTS

| | | | |
|---|---|---|---|
| 4,345,162 A | 8/1982 | Hammer et al. | |
| 4,567,557 A | 1/1986 | Burns | |
| 4,965,492 A | 10/1990 | Boldwyn | |
| 5,293,755 A | 3/1994 | Thomas | |
| 5,384,697 A | 1/1995 | Pascucci | |
| 5,416,781 A | 5/1995 | Ruiz | |
| 5,572,438 A | 11/1996 | Ehlers et al. | |
| 5,650,936 A | 7/1997 | Loucks et al. | |
| 5,861,683 A | 1/1999 | Engel et al. | |
| 5,862,391 A | 1/1999 | Salas et al. | |
| 5,962,989 A | 10/1999 | Baker | |
| 5,971,597 A | 10/1999 | Baldwin et al. | |
| 6,029,092 A | 2/2000 | Stein | |
| 6,119,125 A * | 9/2000 | Gloudeman et al. | 1/1 |
| 6,181,985 B1 | 1/2001 | O'Donnell et al. | |
| 6,211,783 B1 | 4/2001 | Wang | |
| 6,236,332 B1 | 5/2001 | Conkright et al. | |
| 6,285,912 B1 | 9/2001 | Ellison et al. | |
| 6,301,527 B1 | 10/2001 | Butland et al. | |
| 6,553,418 B1 * | 4/2003 | Collins et al. | 709/224 |
| 6,556,875 B1 | 4/2003 | Nagasaka et al. | |
| 6,571,140 B1 | 5/2003 | Wewalaarachchi et al. | |
| 6,615,088 B1 | 9/2003 | Myer et al. | |
| 6,681,154 B2 | 1/2004 | Nierlich et al. | |
| 6,724,157 B2 | 4/2004 | Kazanov et al. | |
| 6,725,104 B2 | 4/2004 | Lo et al. | |
| 6,728,646 B2 * | 4/2004 | Howell et al. | 702/62 |
| 6,751,562 B1 | 6/2004 | Blackett et al. | |
| 6,795,798 B2 * | 9/2004 | Eryurek et al. | 702/188 |
| 6,819,239 B2 | 11/2004 | Bingham | |
| 6,834,208 B2 * | 12/2004 | Gonzales et al. | 700/86 |
| 6,993,417 B2 | 1/2006 | Osann, Jr. | |
| 7,062,361 B1 * | 6/2006 | Lane | 700/295 |
| 7,460,930 B1 | 12/2008 | Howell et al. | |
| 2001/0018712 A1 | 8/2001 | Swales et al. | |
| 2002/0029085 A1 | 3/2002 | Park | |
| 2002/0175641 A1 | 11/2002 | Andersen et al. | |
| 2002/0175642 A1 | 11/2002 | von Kannewurff et al. | |
| 2003/0050737 A1 | 3/2003 | Osann, Jr. | |
| 2003/0125886 A1 | 7/2003 | Spitaels et al. | |
| 2003/0204756 A1 | 10/2003 | Ransom et al. | |
| 2004/0002792 A1 | 1/2004 | Hoffknecht | |
| 2004/0024483 A1 | 2/2004 | Holcombe | |
| 2004/0054829 A1 | 3/2004 | White, III et al. | |
| 2004/0078153 A1 * | 4/2004 | Bartone et al. | 702/57 |
| 2004/0122833 A1 * | 6/2004 | Forth et al. | 707/100 |
| 2004/0212325 A1 * | 10/2004 | Adamson et al. | 315/312 |
| 2005/0007096 A1 * | 1/2005 | Dimino et al. | 324/142 |
| 2005/0013075 A1 | 1/2005 | Kohlmeier-Beckmann et al. | |
| 2005/0039040 A1 | 2/2005 | Ransom et al. | |
| 2005/0040943 A1 | 2/2005 | Winick | |
| 2005/0090915 A1 | 4/2005 | Geiwitz | |
| 2005/0096797 A1 | 5/2005 | Matsubara et al. | |
| 2005/0097162 A1 | 5/2005 | Budike, Jr. | |
| 2005/0125083 A1 | 6/2005 | Kiko | |
| 2005/0131583 A1 | 6/2005 | Ransom | |
| 2005/0222820 A1 | 10/2005 | Chung | |
| 2006/0025891 A1 * | 2/2006 | Budike | 700/275 |
| 2006/0259184 A1 | 11/2006 | Hayes et al. | |
| 2007/0075854 A1 | 4/2007 | Tyler | |

OTHER PUBLICATIONS

Reliable Controls, "Product Controllers", pp. 1-2, [online], [retrieved on Apr. 22, 2004]. Retrieved from the Internet <URL: http://www.reliablecontrols.com/products/controllers/>.

Reliable Controls, "Reliable Controls MACH-System", pp. 1-6, [online], [retrieved on Apr. 22, 2004]. Retrieved from the Internet <URL:www.reliablecontrols.com/products/catalogue/product_promotional.pdf>.

ISEP Modbus Alert Email (Email -Alert-03), [online]. [retrieved on Apr. 26, 2004] Retrieved from website of ise_p.com using Internet <URL:http://www.ise_p/links/Alertgateway/MODEMAIL.htm>.

Intelicom Innovation NetBiter TM, retrieved from website of www.intellicom.se using Internet <URL:http://www.intelicom.se/eg_netbiter.shtml>.

LinkNet TM Platform, [online], [retrieved on Apr. 27, 2004] Retrieved from website of kavel.com using Internet <URL: http://www.kavel.com>.

BMA BACnet Manufacturers Association, Catalogue Listings for BA net Application Specific Controller (B-ASC), [online], [retrieved on 2004-04-027] Retrieved from website of www.bacnetassociation.org using Interner <URL:http:///wwwbacnetassociation.org/BMAProductCatalogue/Profiles/A11B-ASC.htm>.

BACnet Today, ASHRAE (American Society of Heating, Refrigerating and Air-Conditioning Engineers) Journal, p. 10-17 (Oct. 2002).

ADM-3311 Specifications, ADMMicro, LLC (Jul. 24, 2002).

E-mail from Mark Vinson of Jun. 27, 2002.

Document containing e-mails from Don Howell of May 23, 2003 and May 20, 2003.

ADM-3311, The Multi-Circuit High Density Power Monitor From ADMMicro, Product Overview (May 20, 2003).

Non-Final Office Action issued in U.S. Appl. No. 11/128,344 (now US Patent No. 7,460,930) dated Jun. 7, 2007.

Final Office Action issued in U.S. Appl. No. 11/128,344 (now US Patent No. 7,460,930) dated Nov. 19, 2007.

Notice of Allowance issued in U.S. Appl. No. 11/128,344 (now US Patent No. 7,460,930) dated Oct. 10, 2008.

The Specification as filed in U.S. Appl. No. 11/470,607 on Sep. 6, 2006.

Office Action issued in U.S. Appl. No. 11/470,607 dated Jun. 12, 2008.

Intelicom Innovation NetBiter TM, [online]. [retrieved on Apr. 26, 2004] Retrieved from website of www.intellicom.se using Internet <URL:http://www.intelicom.se/eg_netbiter.shtml>.

Notice of Allowance issued in U.S. Appl. No. 11/470,607 dated Oct. 5, 2009.

\* cited by examiner

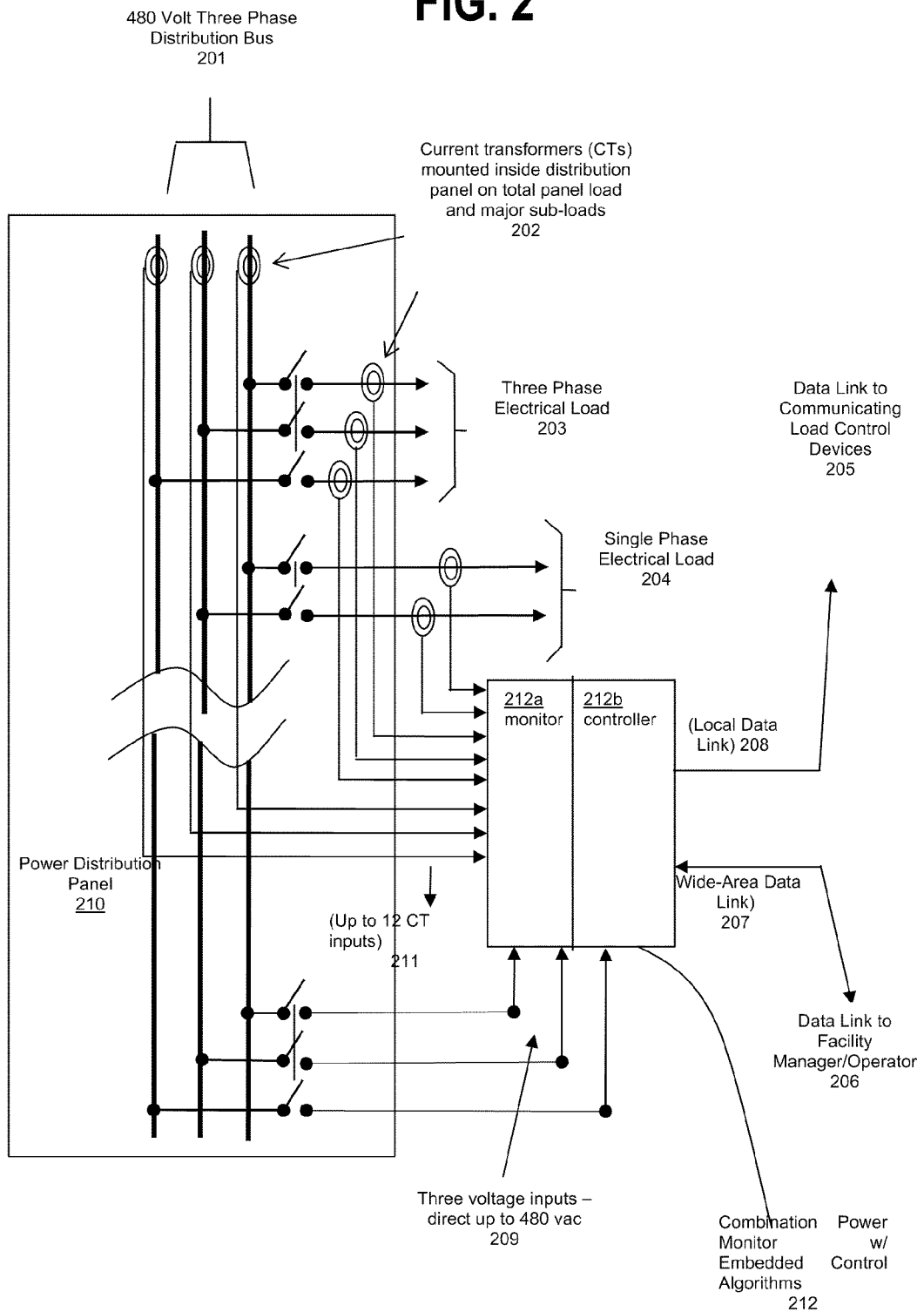

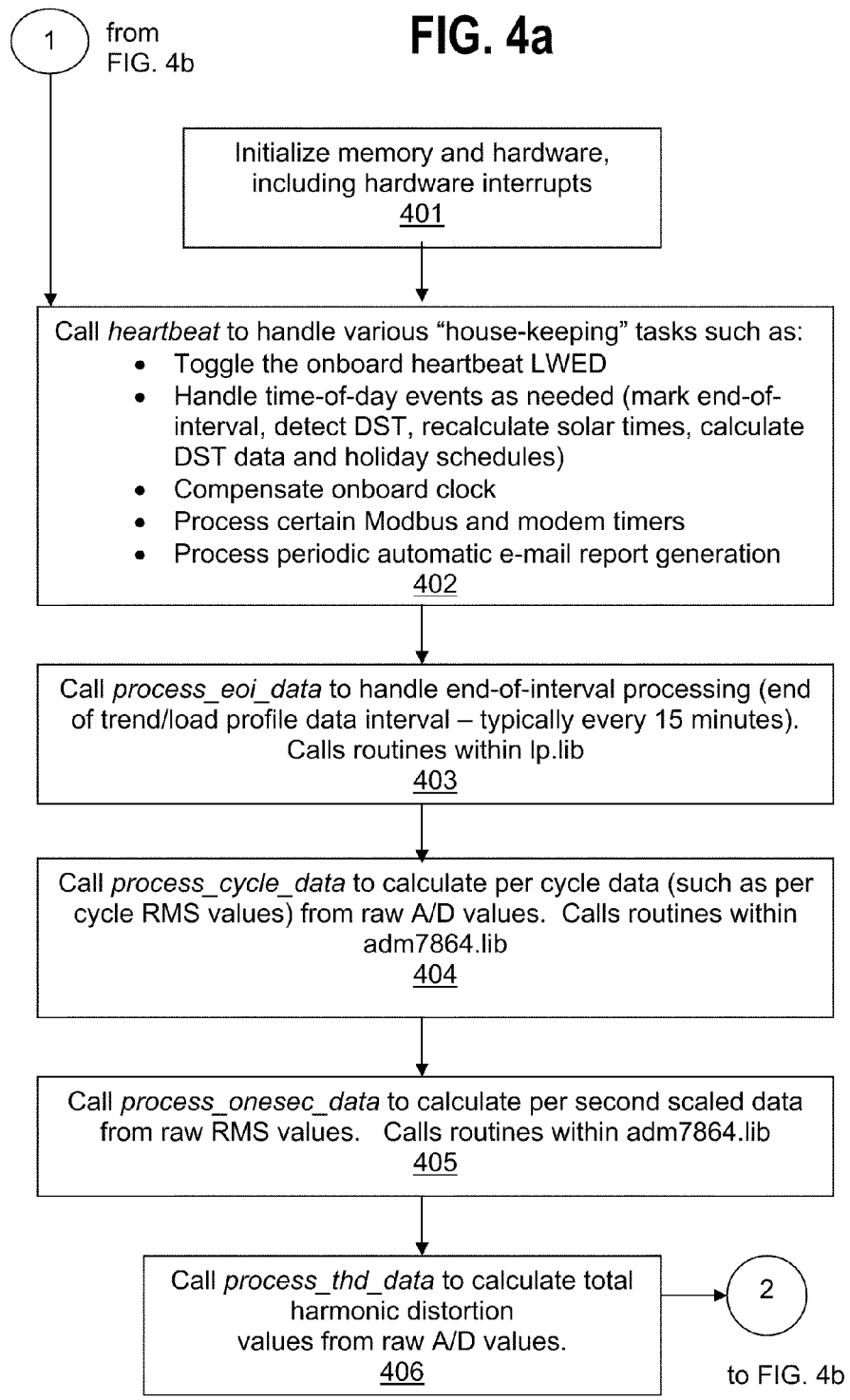

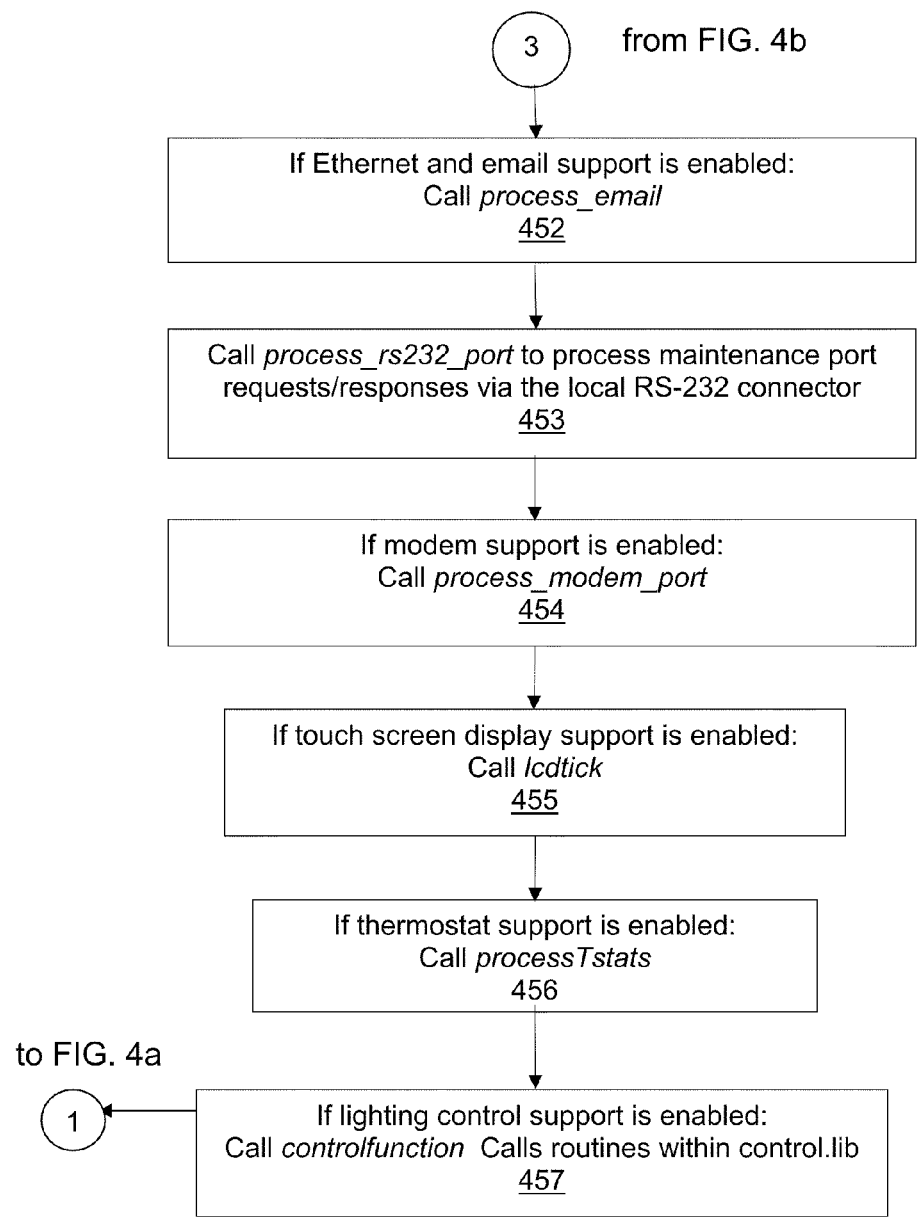

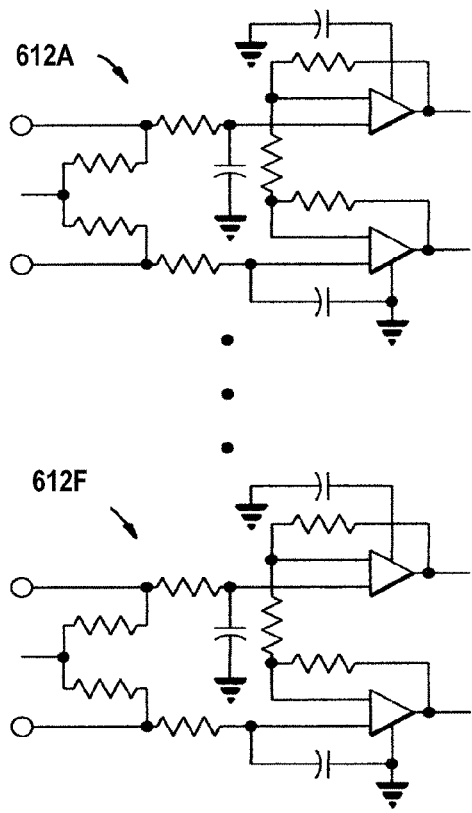
FIG. 6B
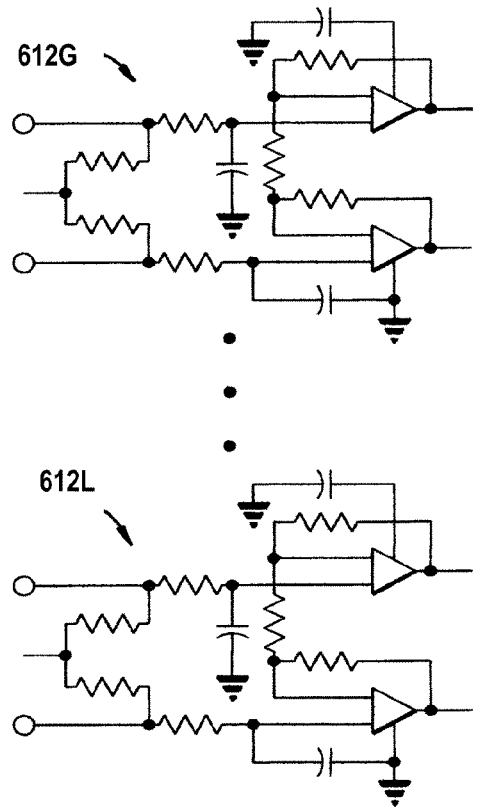
FIG. 6C
FIG. 6I
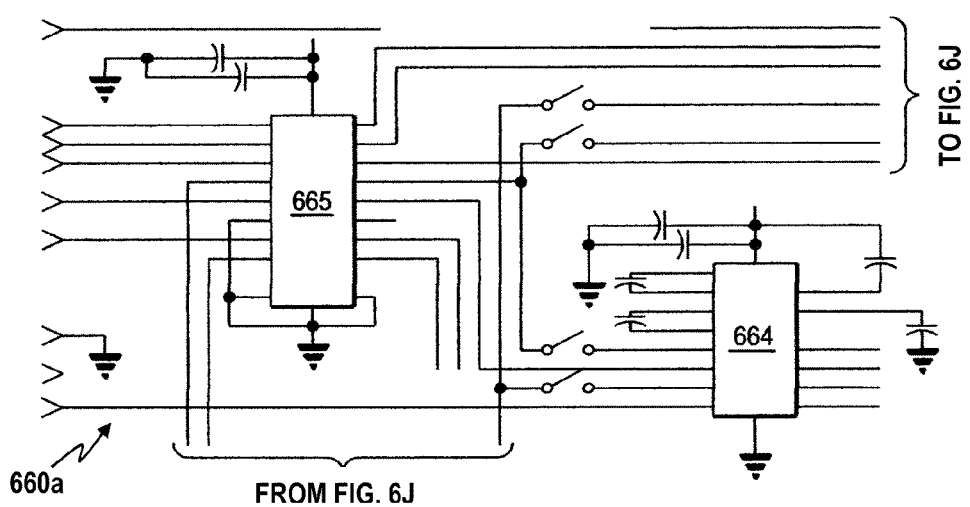

TO FIG. 6D(b)

LIGHTING PERFORMANCE POWER MONITORING SYSTEM AND METHOD WITH OPTIONAL INTEGRATED LIGHT CONTROL

CROSS REFERENCE TO RELATED APPLICATION

The present application is a Continuation of U.S. patent application Ser. No. 11/741,744 filed Apr. 28, 2007 and claims the benefit of U.S. provisional patent application No. 60/795,644, filed Apr. 28, 2006, both of which are incorporated herein by reference in their entirety.

FIELD OF THE INVENTION

The present invention relates to monitoring systems and methods for detecting power usage and control of lighting systems. More particularly, the present invention provides an automated notification system that a light monitoring system requires replacement of items such as bulbs, ballasts, which may or may not be integrated with a lighting control/actuation system.

BACKGROUND OF THE INVENTION

Maintaining adequate interior and exterior lighting levels is a significant endeavor for many building facility operators. Maintaining proper light intensity is considered to be an important factor for various building usages, including:

(a) Facilitating retail sales from display floor areas; retail store operators have disclosed that there is a correlation with the amount of light used to illuminate products and the store aisles, and the length of time a consumer will remain in a store purchasing items;

(b) Providing adequate egress lighting, particularly during emergency conditions such as loss of normal electrical power; recent power outages due to severe storms and/or terrorist incidents have a number of military and civilian personnel disclosing that lighting was insufficient in emergency exit areas in places open to the public; and (c) Providing adequate workspace lighting for various human work activities. For example, there are some studies showing that overall moods of employees and their productivity are impacted by the amount of lighting in the workplace.

There are a number of lighting control and monitoring systems used to turn on and off lights in stores, malls, parking lots, etc. These systems sometimes include power management to make the power usage as efficient as possible.

U.S. Pat. No. 5,862,391 to Salas et al., which is hereby incorporated in its entirety by reference, discloses a power management control system comprising a computer (server) having standard RS485 interface cards and adapters installed in its I/O slots defining multiple industry standard Modbus RTU networks and Ethernet TCP/IP networks and the computer contains software for monitoring and controlling power usage/consumption captured by remotely controlled devices (Abstract). There is no on-board or downloadable capability for software/firmware power management or for direct device-to-device communication.

US Patent Application 2004/0024483 A1 to Holcombe, which is hereby incorporated in its entirety by reference, discloses a system, method and article of manufacture for monitoring and optimizing utility usage in an entity. Paragraph 0069 at page 4 discloses as an option a central control unit may interact with appliances or interface modules for altering their cycle as needed or turn them on or turn them off at different times.

US Patent Application 2003/0050737 A1 to Osann, Jr., which is hereby incorporated in its entirety by reference, discloses an energy-smart home system (see FIG. 1) that requires energy monitoring and control points installed at switches, plugs, and other points of energy use and communication with a power line data link to a centrally located intelligent device such as a PC, residential gateway, and the like for viewing and energy control functions. A separate electrical breaker box supplements the distributed energy monitoring and control points. The energy-smart system of Osann, Jr. provides internet access to the centrally located intelligent device, utility company, and other service providers (e.g., security) as well as a utility company power meter. Subloads controlled can include direct wired subloads, such as an air-conditioner or furnace.

U.S. Pat. No. 4,034,233 to Leyde, which is hereby incorporated in its entirety by reference, discloses a power monitoring and regulating circuit and method having an analog input representing power delivery rate and a digital output for controlling the on/off states of a plurality of loads (see column 2, lines 37 to 67; claim 1). This invention contemplates the use of a settable set point which through circuitry and not firmware the invention seeks to attain to regulating the number of loads connected to the power source.

U.S. Pat. No. 4,167,679 to Leyde, et al., which is hereby incorporated in its entirety by reference, discloses floating set point control circuit and method for use with electrical load control systems. Column 1, lines 1-36 and claims 1, 8 and 16 disclose an electrical load control systems that continuously measures the rate of power delivered to a plurality of loads and when a predetermined rate, termed a set point, is exceeded or conversely, then one or more of the plurality of loads is disconnected (shed) or connected (added).

U.S. Pat. No. 4,345,162 to Hammer, et al., which is hereby incorporated in its entirety by reference, discloses a method and apparatus for load-shedding duty cycling that overrides a normal thermostat control (see claim 1). A signal from a power utility company is received to the thermostat, such as a radio signal. This invention does not measure power use and controls a single load.

U.S. Pat. No. 6,181,985 to O'Donnell et al., which is hereby incorporated in its entirety by reference, discloses a load shed module for use in a power distribution system that includes facility for delivering both electrical power and electrical power rate information from a utility supplier. This invention is physically placed between and interfaces to a utility power source and a load and requires manually setting a rotary switch on the to a threshold rate. The setting of the rotary switch is compared by the invention with a rate received from a utility supplier. If the received rate exceeds the manually set rate the invention disconnects a load from the power source.

U.S. Pat. No. 6,301,527 B1 to Butland, et al., which is hereby incorporated in its entirety by reference, discloses a Utilities Communications Architecture (UCA) compliant power management control system. Column 2, lines 9-25, discloses first and second intelligent electronic devices communicating over a first and second network with first and second servers that process data received from first and second intelligent electronic devices to manage power use. TCP/IP and RS-485 protocol are supported (claims 2, 8, and 10) as well as other protocols. This invention envisions software loaded into computers and servers to provide access to and control of power management data and functions, respectively, of intelligent electronic power management and control devices of an electrical distribution system.

Dencor Inc., Denver, Colo., US (http://www.dencorinc.com) provides an expansion module for controlling multiple loads via a single unit in order to reduce energy consumption. Reliable Controls, Victoria, British Columbia, Canada (http://www.reliablecontrols.com) provides a MACH-Global Controller that provides LAN communication through nine ports to 128 universal input-output hard points, and a MACH1 and MACH2 controller each supporting communication ports and eight inputs and outputs as well as up to three expansion cards by the MACH2. These systems are described as providing cost effective management of power consumption, e.g., "The Reliable Controls® MACH-System is a computer-based system of hardware and software products designed to control the comfort and manage the energy consumption of the environment with commercial buildings. The system consists of: programmable controllers which have inputs and outputs that are connected to sensors and actuators used to measure and control the environment; network communications to network the controllers to facilitate sharing data and archiving data; PCs to run the various software programs used to program, operate and backup the system." (from web-site FAQ)

However, there is no enabling description of a system that is used for automatic detection that elements of a lighting system (e.g. bulbs, ballasts) require maintenance based on measured values. Nor is the technology employed to manage energy consumption provided on either web-site. The Reliable Controls products do not address non-commercial applications.

The above referenced Web pages primarily describe individual control devices and do not offer any type of integrated power monitoring and control device, nor do they disclose or suggest a device that monitors and alerts when components such as bulbs and ballasts need replacement.

Thus, multi-load self-contained power management devices and power management systems including a remote control PC or Server system therefor are old in the art. Prior art power management devices perform fixed functions and devices exist that can respond to remote control over hard-wired networks. None provide an interfaced control component local to and combined with a monitoring device and none include on-board control software/firmware to capture power measurements and use these measurements to manage multiple loads according to algorithms. Further, none comprise on-board, downloadable software/firmware interfaced with a power monitoring unit or integrated with a power monitor in a single electronic unit and that can be directly networked with like devices to manage power for single or multiple site configurations of loads.

Nor do any of the above-discussed patents disclose a system that monitors when components such as bulbs and ballasts require maintenance, so that the lighting system provides the light at the predetermined power level that it was intended for normal operation.

Also, repair activities must be occasionally undertaken to maintain lighting systems at desired and appropriate levels of light intensity. Light bulb and ballast technologies, as typically employed today, only provide a relatively short service life—much shorter than what is expected from the overall building lighting system. Today, such repair activities are generally inefficient labor-intensive processes characterized by periodic manual visual inspections—or driven by complaints from building occupants after prolonged periods of inadequate lighting. Both of these repair activities are not very different from the activities of maintenance personnel from almost 100 years ago when electric lighting was first installed in office buildings. Egress lighting deficiencies are frequently discovered as a result of risk to human safety during emergency conditions, often where evacuees later complained. Thus there is a need both from at least an efficiency standpoint and from a safety standpoint to improve on the method of monitoring lighting systems.

SUMMARY OF THE INVENTION

A first aspect of the invention is to provide system and a method for "as-needed" proactive maintenance of lighting systems through continuous monitoring of the electric power characteristics of lighting circuits. This monitoring is used to automatically determine when lighting systems are not performing adequately.

This invention also provides a system and method for integration of electric power monitoring into lighting control devices such that the equipment which turns lights on and off (based on building occupancy, hour of the day, etc.) can also provide the continuous monitoring required to automatically identify deficiencies in the lighting system.

Another aspect of the invention provides a lighting performance monitoring system and method via electric power monitoring. As lighting system components fail, such as bulbs and ballasts, the electric power consumption of the lighting system changes characteristics. This invention provides for continuous monitoring of the lighting system electric power consumption such that failure of system components can be automatically detected at the time when such failures occur. This invention also provides a mechanism through which the type of the failed component may be automatically identified—such as bulb or ballast. This capability requires that the power consumption characteristics of individual system components are known for their various failure modes. This invention also provides for the transmission of automatic notifications to appropriate maintenance personnel, based on the above continuous monitoring.

The lighting performance power monitoring system continuously monitors the electrical load characteristics of lighting circuits. This is accomplished by electronic sampling of the voltage (1) and current (2) waveforms associated with lighting circuits, and using these values to calculate the required electrical load properties such as real power (watts), reactive power (vars), and apparent power (va). The desired electrical load properties may vary, depending upon the type of lighting fixtures.

In addition, the lighting performance power monitoring system continuously compares the present electrical load characteristics of lighting circuits to one or more baseline values. The baseline values are established through a calibration process that is executed when the lighting circuits are known to be performing at full capability. When the present electrical load characteristics deviate from baseline values by more than a predefined delta, the lighting circuit is considered to be performing inadequately and an automatic electronic notification may be sent to maintenance personnel at predefined electronic addresses. The automatic notification may include information concerning the probable type of component (bulb, ballast, etc.) that has failed, based on the magnitude of change in one or more electrical load properties (watts, vars, etc.).

The invention can also be incorporated into a system which integrates lighting performance monitoring, as discussed above, and lighting control. Electrical load switching devices are normally provided so that building lights can be turned on or off based on building occupancy. This is done to conserve energy and to inform the public when facilities are open business. Such load switching capability may be provided through lighting control units that are designed to serve multiple lighting circuits under the control of timers, daylight sensors (photocells, etc.), or more sophisticated energy management systems. This embodiment provides for the integration of lighting performance monitoring with lighting control units to reduce over-all material and labor costs as well as physical space requirements.

For example, the invention may employ an integrated unit which provides both lighting load switching devices and electrical load power monitoring to continuously monitor lighting performance. This embodiment could employ a lighting controller and performance monitor unit which has an electronic sub-assembly that serves multiple purposes including: Automated control of lighting circuit load switching devices through a two-way data link with an energy management system or through control algorithms stored locally within the Lighting Controller and Performance Monitor; Automated lighting performance monitoring as described above; and Automated notification of maintenance personnel via a connected energy management system or through a dedicated data link.

A typical device that may be employed for the combination lighting control and performance monitoring may be a power management device, including: a monitor module that directly monitors energy usage of at least one energy load to generate at least one measurement of energy usage by the at least one energy load; and, if desired, a control module operatively coupled to the monitor module to control energy usage by the at least one energy load in a pre-determined manner that is based on the at least one measurement of energy usage, wherein the control module controls the at least one energy load via a data link.

By monitor module is meant any component(s) that directly monitors energy usage of at least one energy load to generate at least one measurement of energy usage by the at least one energy load.

By control module is meant any component(s) that control energy usage by the at least one energy load in a pre-determined manner that is based on the at least one measurement of energy usage. The monitor module may have separate hardware/software components from the control module, or the monitor module may share some or all of its hardware/software components with the control module.

The control module is optional for the aspect of the present invention involving monitoring the electric power characteristics of lighting circuits to determine when maintenance is needed. For example, a monitor module with a capability to transmit notifications to appropriate maintenance personnel based on the monitoring may suffice.

BRIEF DESCRIPTION OF THE DRAWINGS

FIG. 1b is a flowchart presenting the operational steps performed by the device in FIG. 1a.

FIG. 2 illustrates an electrical distribution panel diagram configured according with a device according to the present invention to control multiple subloads.

FIGS. 4a, 4b and 4c illustrate a flow diagram of control software/firmware for the monitor/controller embodiment of FIG. 1d.

FIG. 6A illustrates a schematic diagram of a preferred embodiment of the combination monitor-controller illustrated in FIG. 5.

FIGS. 6B and 6C illustrate enlarged views of a current monitoring interface of the combination monitor-controller illustrated in FIG. 6A.

FIG. 6D(b) illustrates an enlarged view of a voltage monitoring interface of the combination monitor-controller illustrated in FIG. 6A.

FIGS. 6I and 6J illustrate enlarged views of a remote communication interface of the combination monitor-controller illustrated in FIG. 6A.

DETAILED DESCRIPTION

In the following discussions for purposes of clarity with respect to explaining the current invention, common components are numbered according to their first appearance in a drawing and well-known components are to be interpreted according to the understanding of a person ordinarily skilled in the art, e.g., wide area network (WAN) and Bluetooth are well-known in the art and are not described but given their well-known meanings.

Lighting Performance Monitor

Figure 1A:
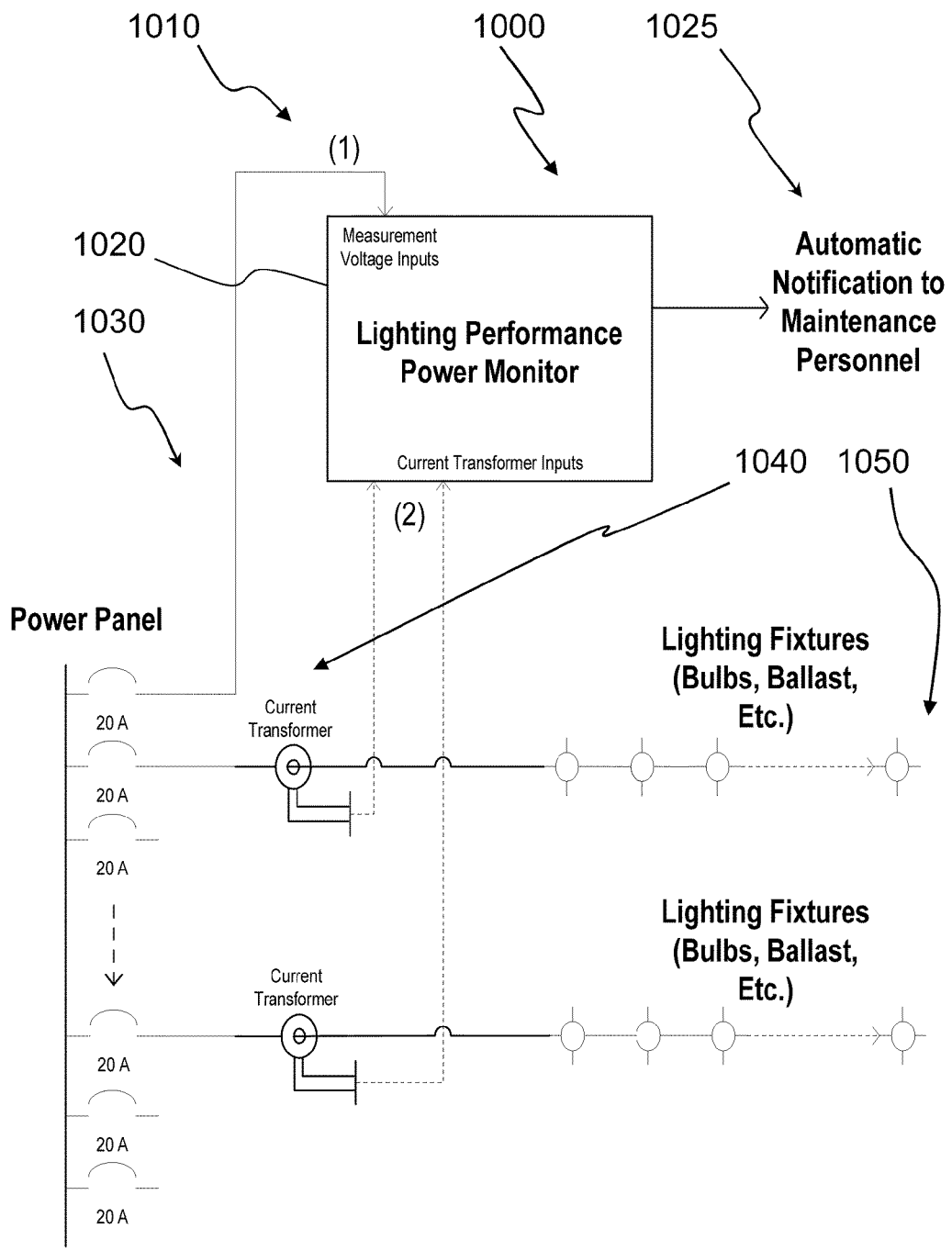
FIG. 1a illustrates an embodiment of lighting performance power monitor according to the present invention that detects and notifies maintenance personnel.

FIG. 1a is a schematic of an embodiment of a lighting performance monitor according to the present invention. As shown in the drawing, the lighting performance power monitor 1000 includes voltage measurement inputs 1010 and current transformer inputs 1020. There is a power panel 1030 from which a plurality of circuits light up different zones, (e.g. areas) of a particular retail establishment, office, etc. Both the voltage and the current waveforms are sampled to calculate the electrical load, such as power (watts), reactive power (vars), and apparent power (va). The properties of the load may vary, of course, depending on the type of lighting fixtures.

Figure 1B:
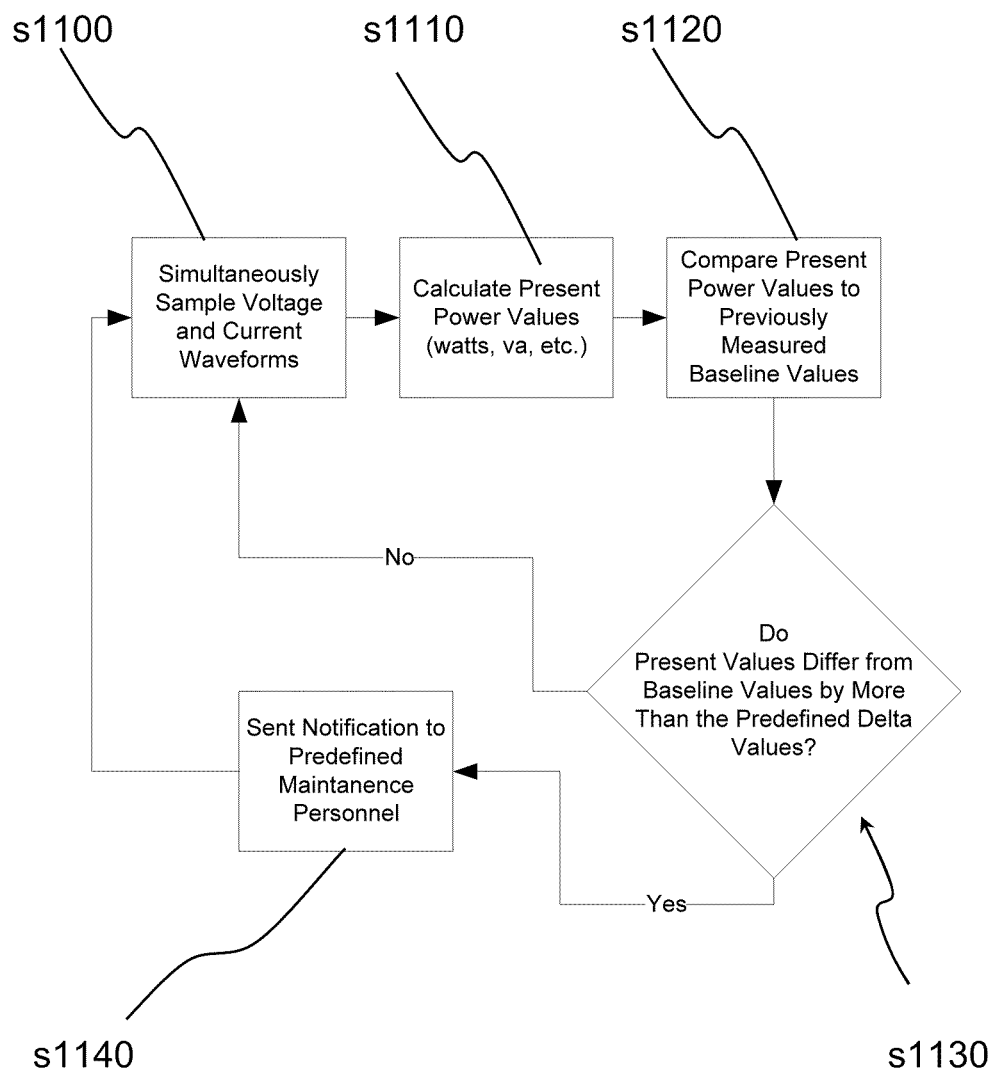

FIG. 1b provides a flowchart that shows the operational steps that a system as in the present invention can operate. This flowchart is shown for purposes of illustration and does not limit the invention to the types of measurements shown or the specific steps that are described.

Referring to FIGS. 1a and 1b, at step 1100 the lighting performance monitor (and Controller) simultaneously samples voltage and current waveforms, with the voltage measurement in this case being provided at input 1010 (shown in FIG. 1a) and the current input 1020 from current transformer 1040. The light fixtures (bulbs, ballast, etc) 1050 (shown in FIG. 1a) all draw a certain amount of power while operational. Thus a baseline should be established with all of the lights being operational, and there can be variances (such as also establishing a baseline with 50% of the lights being operational, 25%, etc) and these values are recorded.

The Lighting Performance Power Monitor 1000 continuously compares the present electrical load characteristics of lighting circuits to one or more baseline values. Baseline values are established through a calibration process that is executed when the lighting circuits are known to be performing at full capability.

At step 1110, the present power values are calculated. At step 1120, these values are compared with the baseline values. At step 1130 it is determined whether the present values differ from the baseline values by more than the predefined values. If no, the operation of simultaneous measurement starts at step 1100 again. However, when the present values differ from the baseline values by more than a predetermined amount, at step 1140, notification is sent to maintenance personnel, and/or whomever is designated to be a recipient of these messages. When the deviation of the electrical load characteristics deviate from baseline values by more than a predefined delta, the maintenance person will presumably go on site with the replacement equipment, or possibly request or perform a visual inspection to locate the light fixture that is not operating properly. The performance monitor can, for example, identify the malfunctioning individual circuit and the zone that requires attention. Essentially, if a light burns out, the amount of power drawn should decrease by a mount in the area of the predetermined delta. In fact, in the case of multiple failures the lighting performance monitor could issue an alert that more than one light fixture is malfunctioning, based on the amount of deviation from the baseline (e.g. three light fixtures malfunctioning would caused the measured values to deviate from the baseline more than if one light fixture malfunctions. Again, whether the power reading is peak-to-peak watts, rms, vars, etc., is a selection according to the type of lighting used. However, in virtually all cases, there will be a change in the baseline values if one or more light fixtures malfunctions.

The method of notification can be email via broadband, via telco, wireless, or virtually any form of wire or wireless communication, and may use the Internet, or a private network. In any event, the goal is that the maintenance person can receive, possible even a message on his telephone, a notification that at least one light appears to be malfunctioning based on the characteristics.

Integrated Lighting Performance Monitor and Controller

Figure 1C:
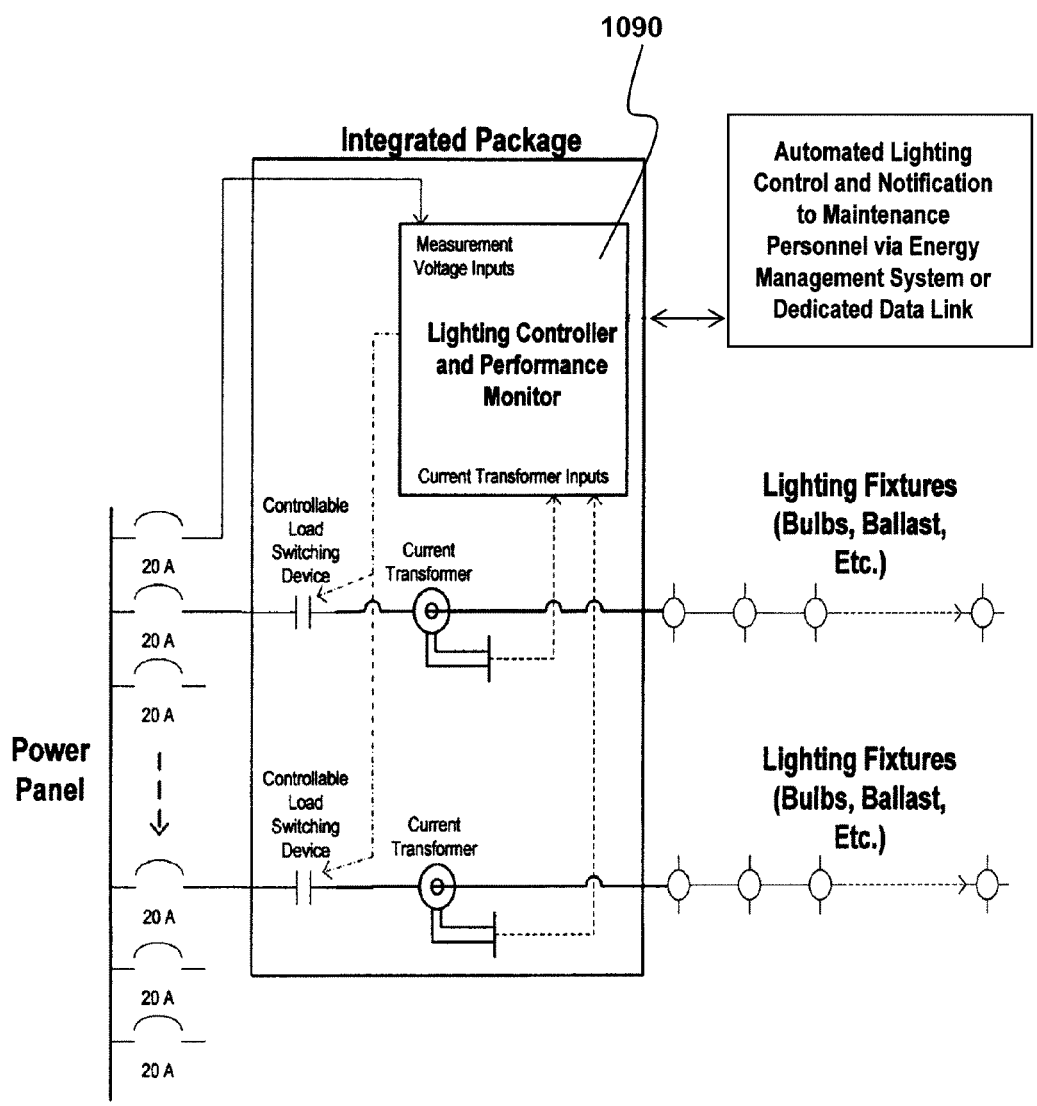
FIG. 1c illustrates another embodiment of the present invention integrated package that combines integrated lighting control and performance monitoring functioning that includes notification of bulb and ballast outages.

FIG. 1c shows another embodiment of the present invention. In this case, there is an integrated package of the lighting performance monitor, and a lighting controller 1090, the controller being a device that monitors usage and turns lights on or off according to certain criteria, such as time of day, day of week, etc. Electrical load switching devices are normally provided so that building lights can be turned on or off based on building occupancy. This is done to conserve energy and to inform the public when facilities are open for business. Such load switching capability may be provided through lighting control units that are designed to serve multiple lighting circuits under the control of timers, daylight sensors (photocells, etc.), or more sophisticated energy management systems. This embodiment provides for the integration of lighting performance monitoring with lighting control units to reduce over-all material and labor costs as well as physical space requirements.

As shown in FIG. 1c, there are controllable load switching devices, so the light fixtures can be switched on or off, or possibly even dimmed to a degree at certain hours. These different states can all be recorded in the baseline values so that the proper comparison is made. For example, if the store closes early on a Sunday, the lights may be turned off, or dimmed at an earlier hour than normal. Thus, the baseline value comparison should be with the ideal desired state of lighting on a Sunday at a certain hour of the day or evening. Thus, not only are power costs saved, but maintenance is improved by the integrated package. It is within the spirit of the invention and the scope of the appended claims to monitor certain zones, and if there is an indication of a malfunction, turn on alternative lighting in the same zone, row, nearby zones, rows, etc.

The monitoring and controller functions can be performed by software, hardware, firmware, and/or combinations of the above. In a preferred embodiment, microprocessor chips have these functions programmed in (and/or burnt in), but there is also a possibility that software could be provided, and thus a computer might be an integral part of the controller/monitor. Updates might be easier on one system versus another, but in any case the invention provides an automated monitoring (and optionally control) of light fixtures and lighting systems.

FIG. 1c shows an integrated unit which provides both lighting load switching devices and electrical load power monitoring to continuously monitor lighting performance. The Lighting Controller and Performance Monitor is an electronic sub-assembly that serves multiple purposes including:

Automated control of lighting circuit load switching devices through a two-way data link with an energy management system or through control algorithms stored locally within the Lighting Controller and Performance Monitor;

Automated lighting performance monitoring as described above;

Automated notification of maintenance personnel via a connected energy management system or through a dedicated data link.

Figure 1D:
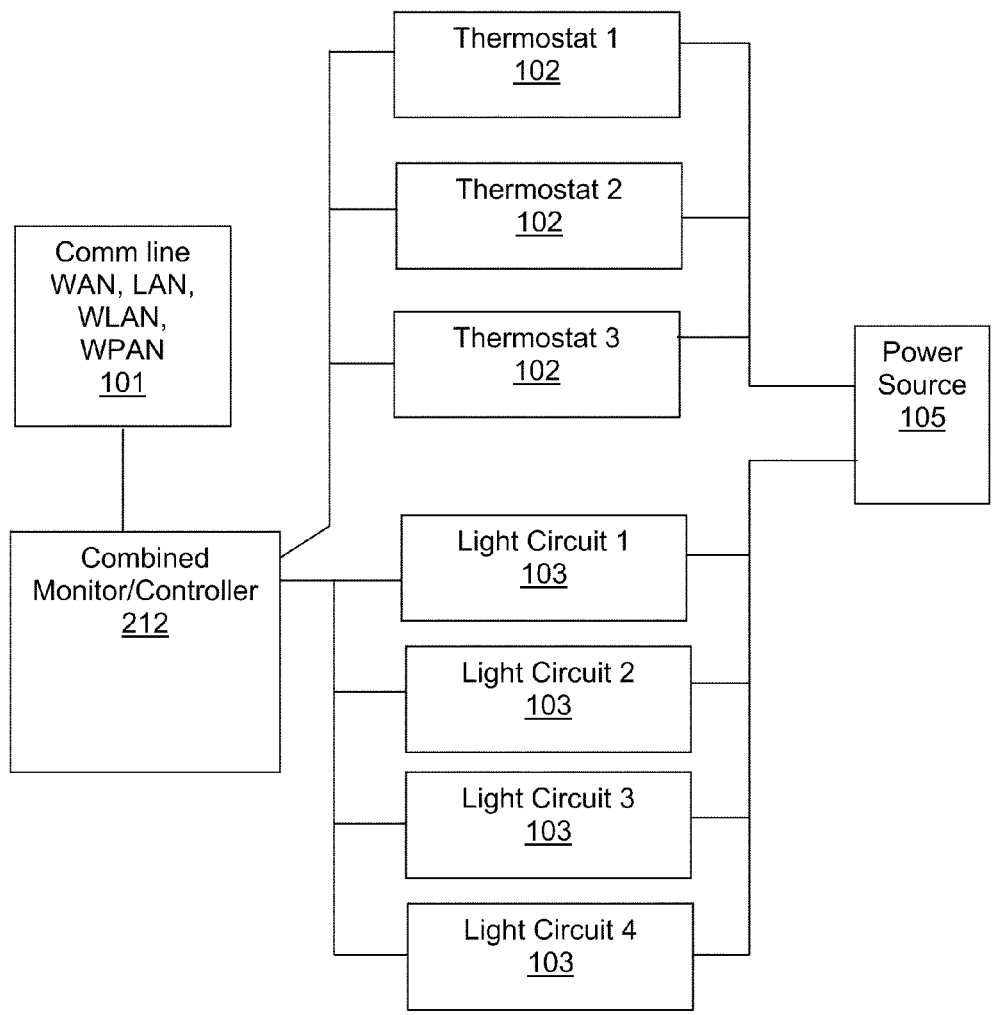
FIG. 1d illustrates an overview schematic a system including a monitor/controller device for performing the present invention.
Figure 1E:
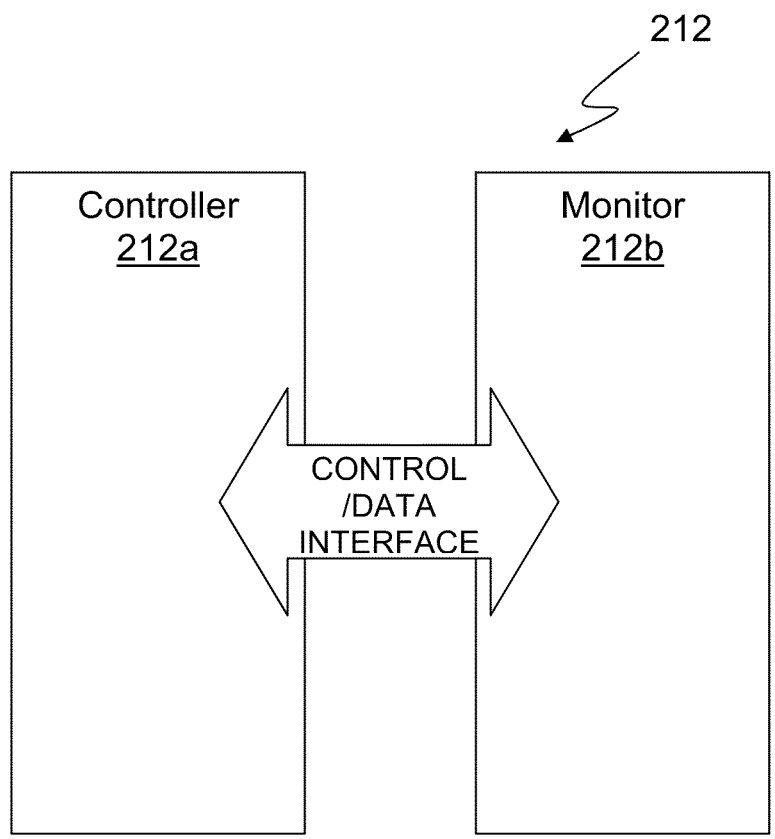
FIG. 1e illustrates an interfaced embodiment of the present invention having separate interfaced control and monitoring components.
Figure 1F:
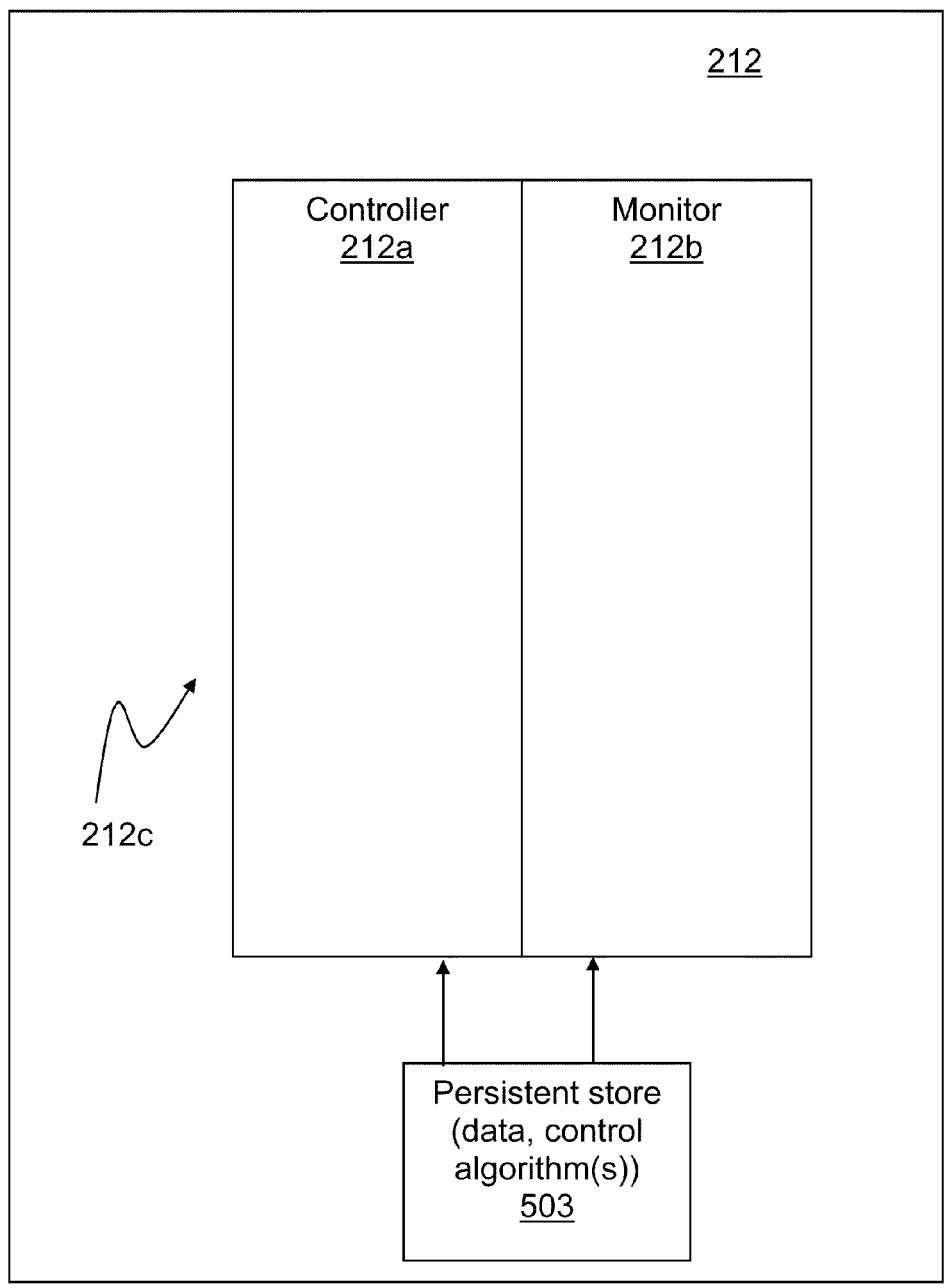
FIG. 1f illustrates an integrated embodiment of the present invention having on board control integrated in the monitoring component.

FIG. 1d illustrates a high level block diagram of an embodiment of the remote/local combined power monitoring/controlling device that can be employed to perform the present invention. Remote access to a combined monitor/controller 212 according to the current invention is provided via at least one of a communication line, a wide area network (WAN), and a wired and/or wireless local area network (LAN) 101. The combined monitor/controller 212 typically is a combination of a single controller unit 212a interfaced to a single monitor unit 212b (see, e.g., FIG. 1b) and preferably is a single integrated electrical unit 212c (see, e.g., FIG. 1c) that monitors and controls the electrical usage of multiple thermostats 102 and multiple light circuits 103, all supplied power by a common power source 105. Based on measured power consumption and at least one pre-determined algorithm stored onboard, the monitor/controller 212 of the present invention controls the settings of the plurality of thermostats 102 (when and at what temperatures they turn on and off) as well as turning on/off each of the plurality of light circuits 103.

To perform monitoring/controlling functions the present invention preferably performs one or more of the following functions within an interfaced control unit 212a or preferably within a single integrated electronic unit 212c:

Directly monitors at least one electrical load;

Directly monitors at least one environmental variable;

Provides a selectable local display of the at least one electrical load;

Provides a selectable local display of the monitored/controlled at least one environmental variable;

Indirectly monitors other energy loads and variables through electronic interfaces with external monitors;

Executes at least one embedded control algorithm to automatically determine a control setting for the at least one electrical loads;

Executes at least one embedded control algorithm to automatically determine a control setting for the at least one environmental variable;

Control algorithms are downloadable and have downloadable parameters for update and tuning;

Indirectly controls at least one energy load through communication with at least one external control device (thermostats, relays, etc.);

Indirectly controls at least one environmental variable through communication with at least one external control device (thermostats, relays, etc.); and Communicates with end-users, computers, and external monitoring and control devices through at least one communication media including Token Ring, Internet, Ethernet, modem, and serial data links.

Thus, the system and method of the present invention may employ a single compact electronic device interfacing/integrating robust communications capabilities and management (control) functions for at least one of at least one energy load; and at least one environmental variable.

In one aspect, the present invention typically comprises downloadable software, preferably firmware, containing the at least one control algorithm.

In another aspect, the present invention typically comprises at least multiple analog-to-digital input channels, and optionally comprises at least one of a current input, an optical circuit, an RS-485 output, an RS-232 output, a wireless network interface, and a wired network interface.

In another aspect, the present invention typically comprises a persistent store for retaining historical data for each monitored load and environmental variable. Retention and purging of these historical data can be controlled remotely and these historical data can be locally displayed.

The present invention typically multiplexes subloads at a single site across a maximum power usage (pre-set or algorithmically determined) as well as multiplexes loads across multiple networked sites. Wired and wireless network protocols are supported to provide inter-site and intra-site connectivity as well as to provide remote control of devices using standard messaging such as e-mail.

Figure 7:
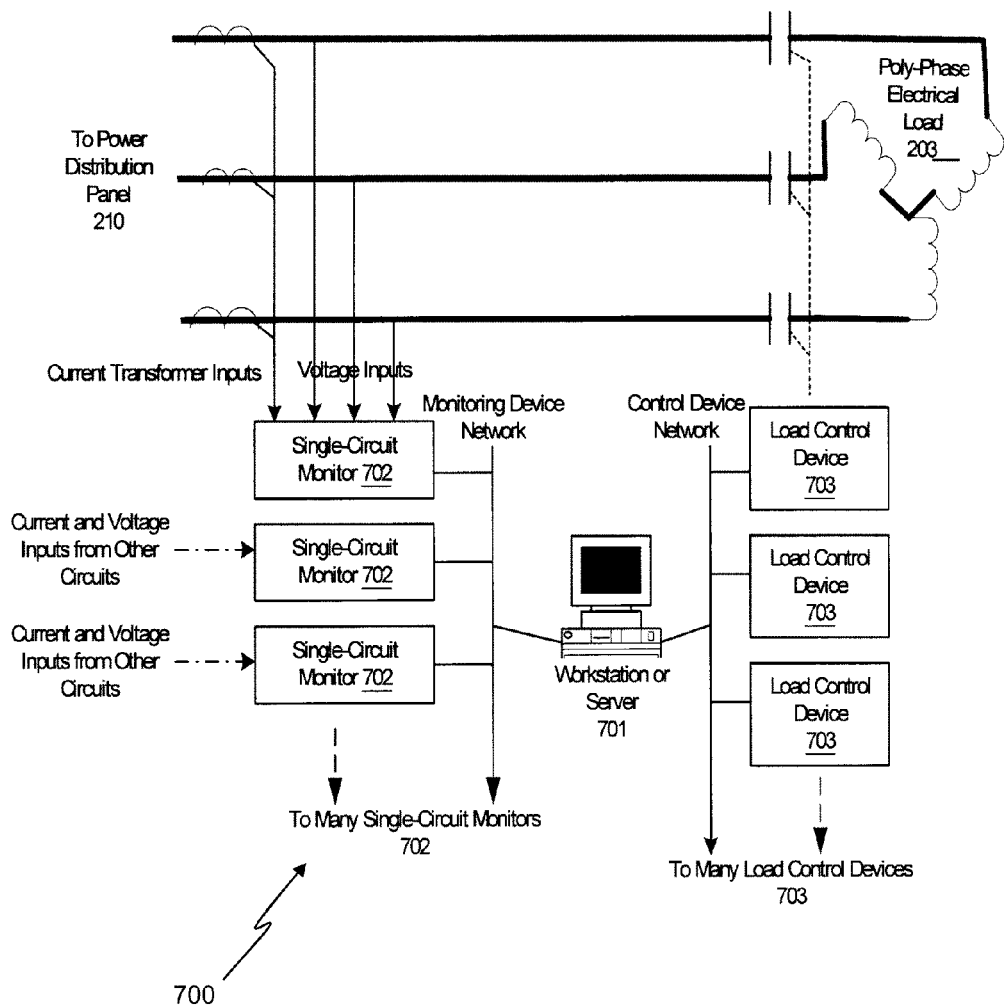
FIG. 7 is a prior art power management system including a host server as a controller.

As illustrated in FIG. 7, systems 700 including single circuit monitors and at least one server 701 that monitor and control multiple electrical loads are well known in the art. Such prior art systems 700 include a plurality of single-circuit (single and poly phase circuits) power monitoring devices (meters) which are periodically interrogated by a host server. The host server 701 uses data from the many power monitoring devices 702 to calculate target setpoints for multiple electrical loads 703 and communicates with a plurality of electrical load control devices 704 to implement the target setpoints (control loads according to the algorithms).

Figure 8:
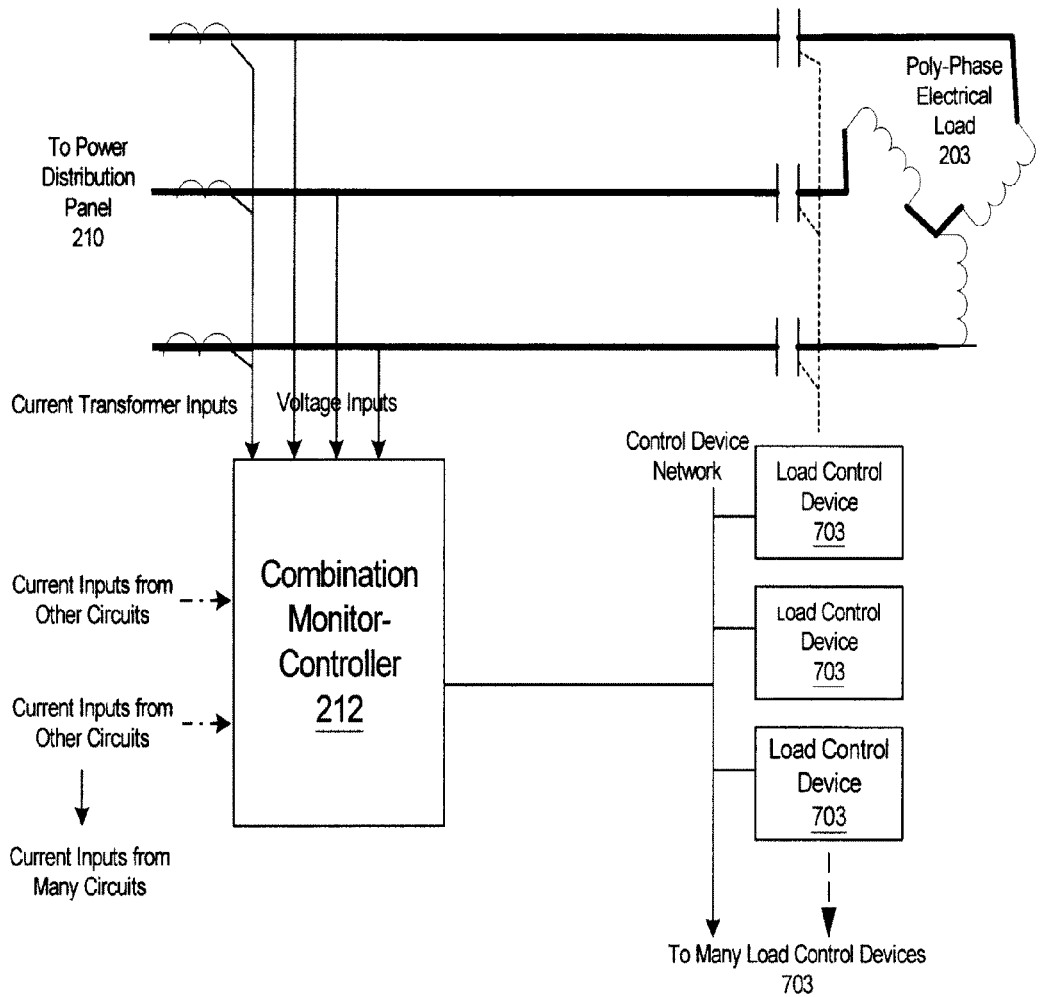
FIG. 8 is the system of FIG. 7 modified according to the present invention.

As illustrated in FIG. 8, the present invention preferably takes advantage of the fact that the power supply for the multiple lighting loads normally comes through a few common power distribution panels 210 (such as circuit breaker panels). The many single-circuit power monitoring devices (traditional approach) are replaced with a few, or just one, multiple-circuit power monitoring controlling device(s) 212 which can significantly reduce the cost, complexity, and physical footprint for the power monitoring component of the energy management system. To this point, most of the energy management systems in use today do not include basic power monitoring due to the cost, complexity, and physical footprint associated with installing multiple single-circuit power monitoring devices (considered too expense to install). As a result, traditional energy management systems cannot make optimal automatic and dynamic control decisions because they do not have real-time power usage data available—resulting in simplistic energy management algorithms that do not realize a significant portion of the potential savings. The preferred advantages of the present invention are significantly based on including an onboard/local multiple circuit power monitoring capability. For example, the present invention may employ a multi-circuit monitor.

The present invention takes advantage of the low-cost, high-performance microprocessors that are readily available today by embedding control algorithms in software locally resident on the device, preferably firmware, directly interfaced with multiple-circuit power monitoring electronics. A device typically is a collection of components in close proximity to each other, e.g., within a single housing or within 5 or less feet apart or within 24 or 12 or less inches apart or within two or more adjacent housings. Traditional energy management systems employ more complex workstation or server class computers and implement the control algorithms in software. These traditional energy management "host" servers are significantly more costly to purchase and operate, are less environmentally rugged, and are subject to many Internet-related security vulnerabilities.

Although the present device may communicate with a server, typically each device has local processing and memory for implementing one or more control algorithms, rather than using the server for implementing the one or more control algorithms.

Combined Monitor/Controller

Figure 5:
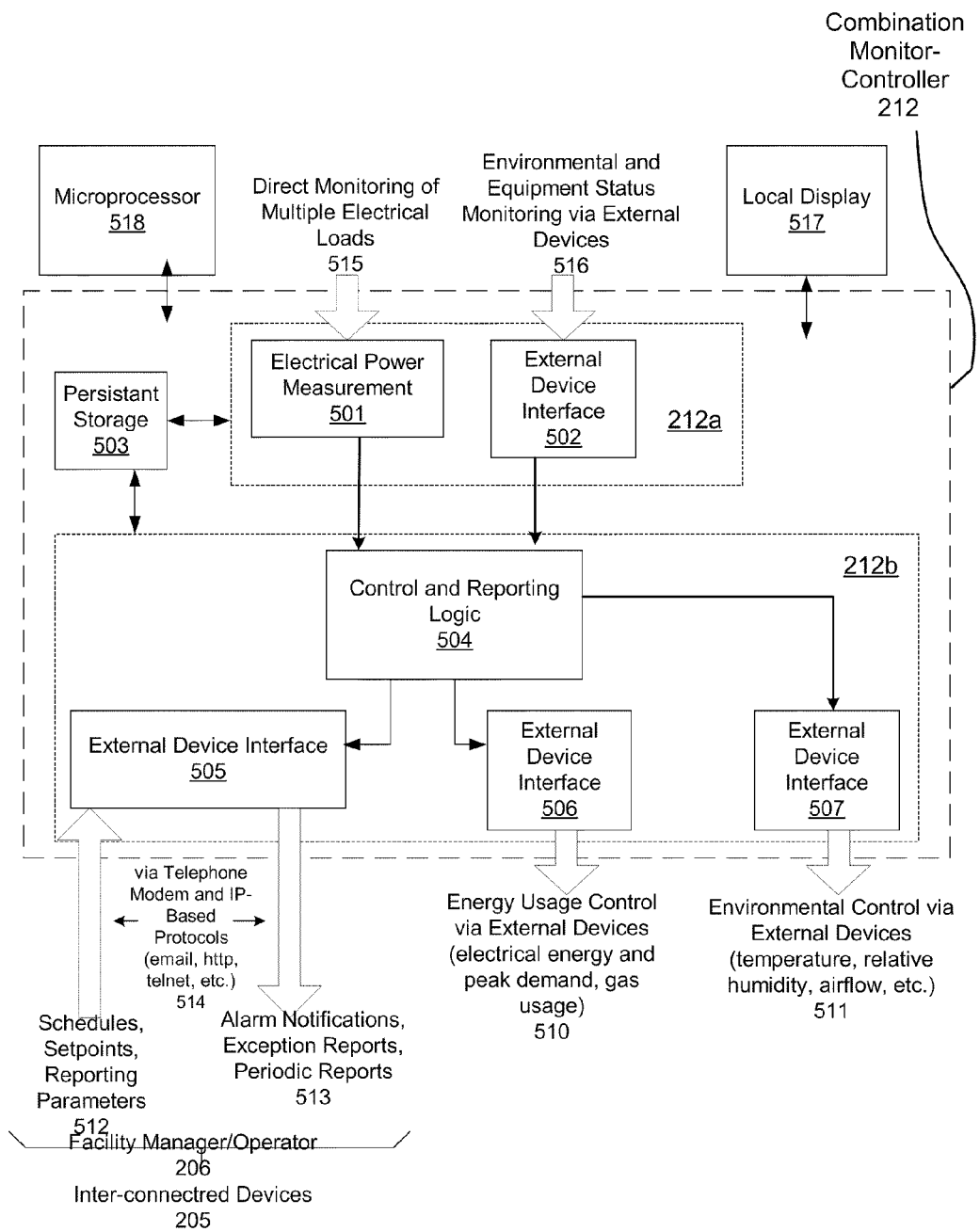
FIG. 5 illustrates the components and interfaces of a tightly integrated combination monitor/controller according to the present invention.

Referring now to FIGS. 2 and 5, a system with embedded control algorithms, that may be employed in an embodiment of the present invention, monitors and controls multiple electrical loads of various configurations 510 511 515 516—including both single 204 and poly-phase applications 203. At least some of the electrical loads are lighting loads. The single monitor/controller 212 is simply wired 209 to common voltages at an electrical distribution panel 210 and can be connected to remote current sensing units 515 to accept power variable measurements. In a preferred embodiment, the monitor/controller 212 of the present invention includes at least one an on-board control algorithm 504 having at least one pre-determined, settable goal. A settable/downloadable threshold is an example of one such goal. The at least one algorithm accepts power 515 and environmental variable 516 measurements as inputs and determines how to control the power consumers 510 and other devices 511 being monitored to achieve at least one goal of the at least one algorithm.

The combined monitor/controller 212 provides advanced sampling, including multiple analog-to-digital converters for fast waveform sampling. All channels (the 12 shown in FIG. 2 are an example only and are not limiting in any sense) 211 are sampled simultaneously so that there is no phase delay introduced as in other systems utilizing sequential sampling techniques. Thus, the monitor/controller 212 of the present invention provides ANSI certified accuracies with harmonic capture and analysis capabilities.

Figure 6A:
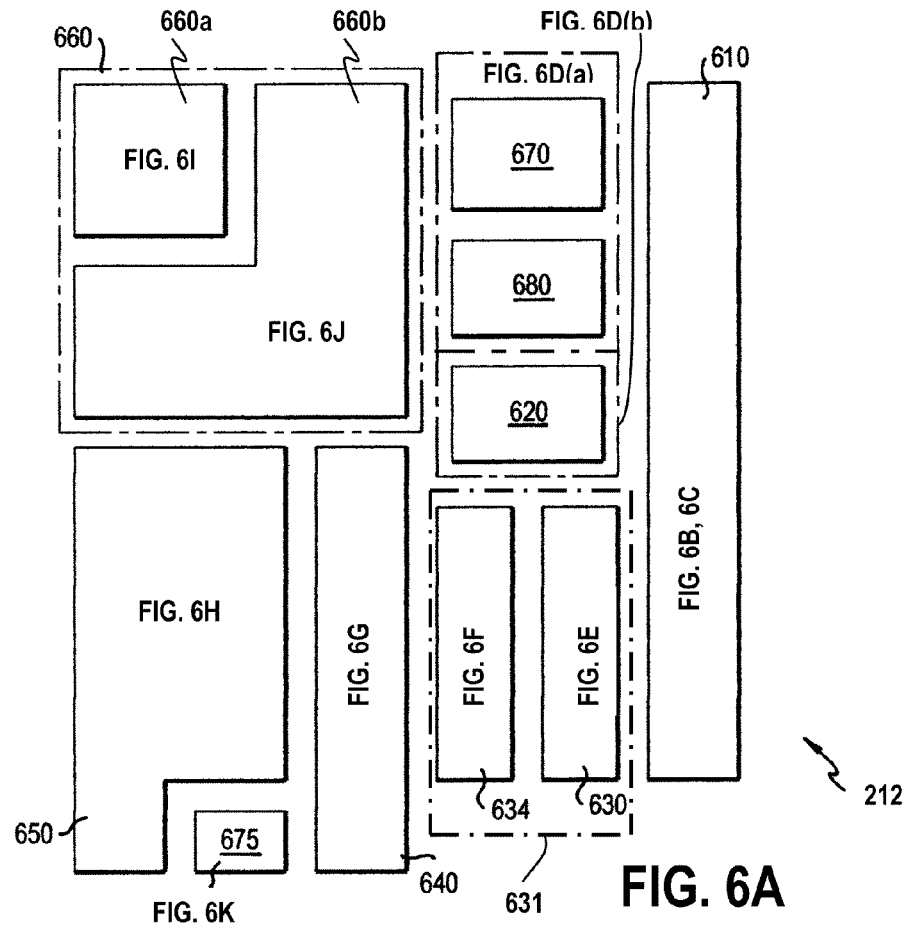
FIGS. 6A, B, C, D(a), D(b), E, F, G, H, I, J and K are combined and detailed views of a wiring diagram of another preferred embodiment of a combination monitor/controller for use in the present invention.

FIG. 6A illustrates a schematic diagram of a preferred embodiment of the combination monitor-controller 212 illustrated in FIG. 5.

Figure 6K:
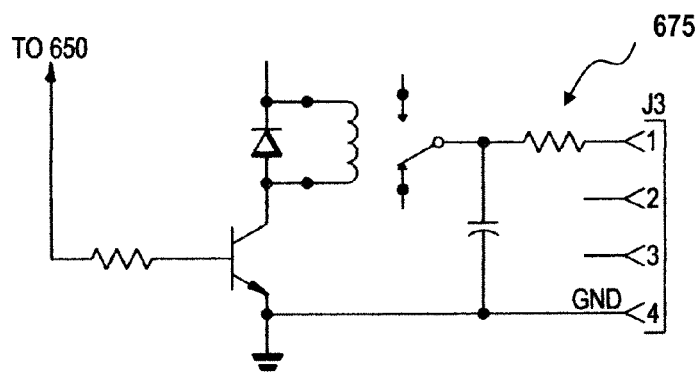
FIG. 6K illustrates an enlarged view another local interface of the combination monitor-controller illustrated in FIG. 6A.
Figure 6D:
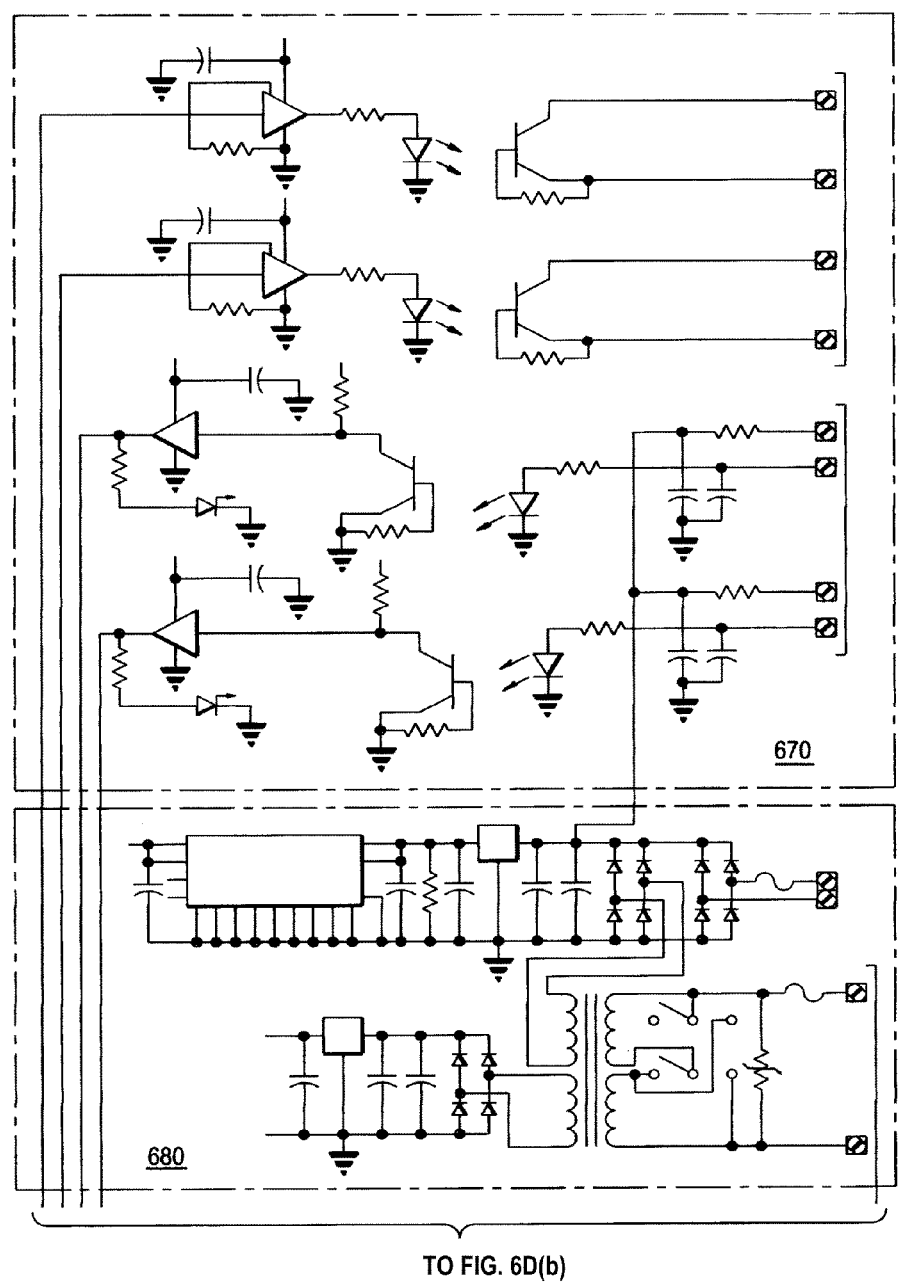
FIG. 6D(a) illustrates an enlarged view of a local control interface, and a direct current power supply of the combination monitor-controller illustrated in FIG. 6A.
Figure 6D:
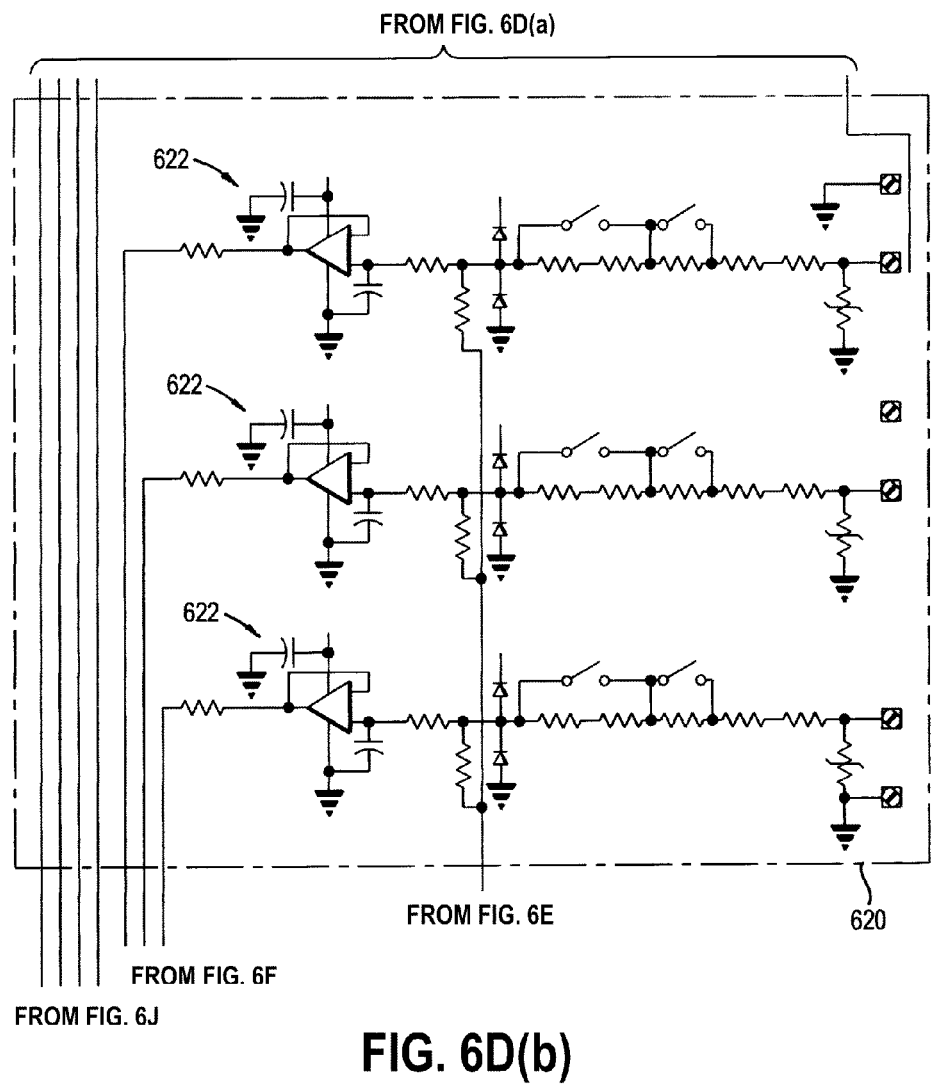

Monitor/controller 212 includes a current monitoring interface 610, a voltage monitoring interface 620, an analog-to-digital (A/D) converter 631 (having parts 630 and 634), a high voltage opto-isolator 640, a data flow controller 650, a remote communication interface 660, local control interfaces 670 (FIG. 6D(a)) and 675 (FIG. 6K), and a direct current (dc) power supply 680. Together, these components, in cooperation with external devices, provide a capability to monitor and manage the energy supplied to loads by multiple power circuits.

Current monitoring interface 610 provides a twelve-channel interface between the power circuits being monitored and electrical A/D converter 631.

FIGS. 6B and 6C illustrate enlarged views of portions of the current monitoring interface 610 of the combination monitor-controller illustrated in FIG. 6A including low-pass filters 612A-F shown in FIG. 6B and low-pass filters 612G-L shown in FIG. 6C.

Each of the twelve channels is connected to a separate power circuit to monitor the flow of current through the circuit. The connection is made with a current tap at both a supply (i.e., hot) line and a return (i.e., neutral) line of the power circuit using a current transformer. Each current tap provides a waveform signal that is representative of the current flow at the tap point. Together, the supply and return line waveforms of the power circuit provide a differential signal pair representing the current flow through the power circuit and this pair is provided to one channel of current monitoring interface 610. Use of the differential signal waveform is preferred to the use of either one of the individual waveform signals because the individual waveform signals usually have the same noise components superimposed on them and these noise components can be largely eliminated by measuring the differential amplitude between the two individual waveforms.

For each of the monitored power circuits, the corresponding supply and return waveform signals are filtered and impedance buffered by a low-pass filter 612.

Thereafter, each of the filtered and buffered differential signal pairs is provided to a separate one of twelve corresponding channels of A/D converter section 631. FIG. 6A illustrates analog-to-digital (A/D) converter 631 having portions 630 and 634.

Figure 6E:
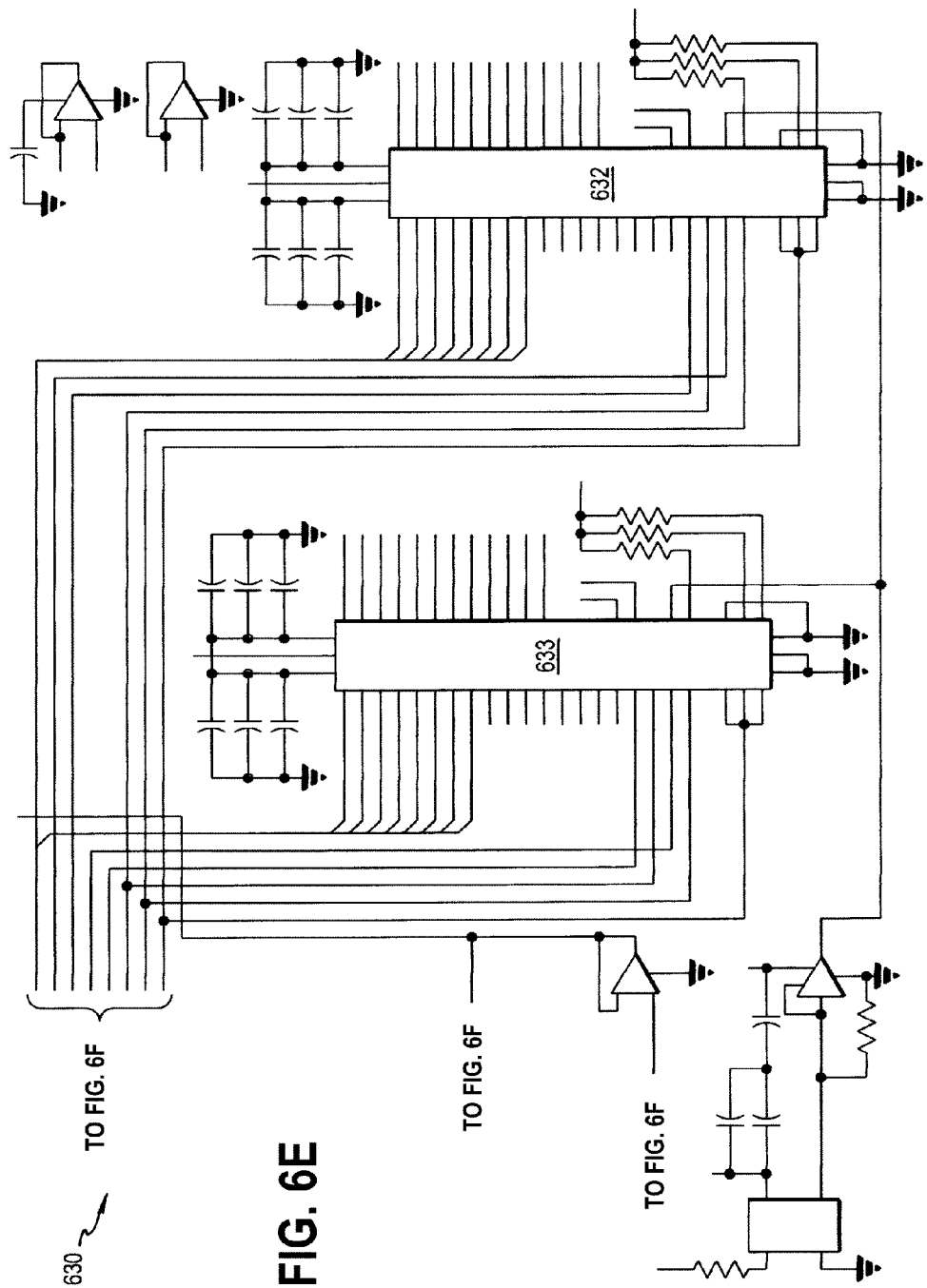
FIGS. 6E and 6F illustrate enlarged views of portions of an analog-to-digital converter of the combination monitor-controller illustrated in FIG. 6A.

FIG. 6E illustrates an enlarged view of portion 630 of the analog-to-digital (A/D) converter 631.

Figure 6F:
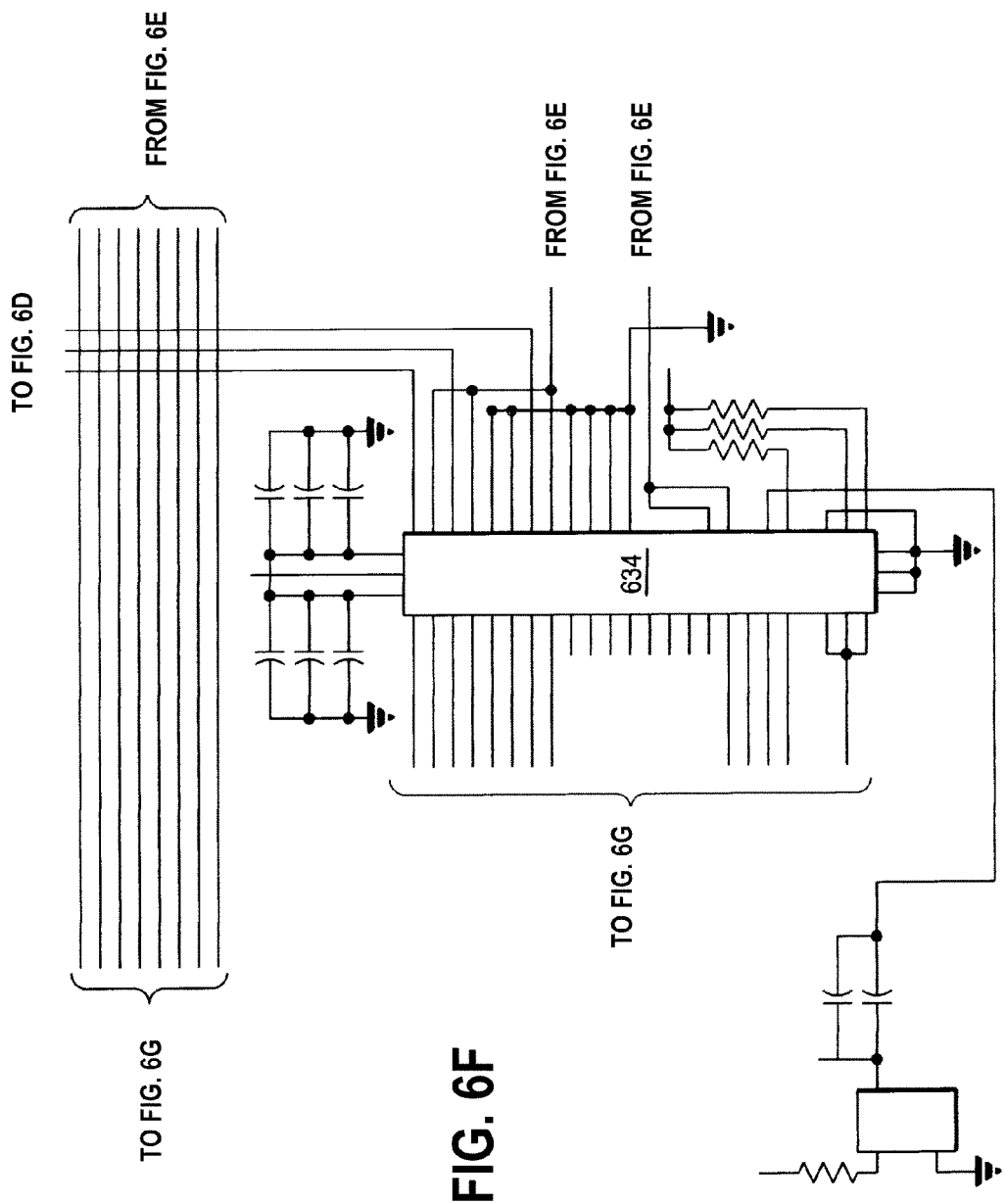

FIG. 6F illustrates an enlarged view of portion 634 of the analog-to-digital (A/D) converter 631. In particular, FIG. 6F illustrates an enlarged view of an analog-to-digital (A/D) converter 634.

Accordingly, each one of the twelve A/D converter channels has first and second inputs that respectively receive the filtered and buffered supply and return line waveform signals of the differential signal pair corresponding to one of the twelve power circuits being monitored.

FIG. 6D(b) illustrates an enlarged view of a voltage monitoring interface 620 of the combination monitor-controller illustrated in FIG. 6A.

Voltage monitoring interface 620 provides a three-phase interface to a power line supplying power to each of the power circuits being monitored. For each phase of the power line, a voltage tap is provided to communicate a voltage waveform, representing the voltage changes occurring on the phase, to a separate one of three low-pass filters 622. Low-pass filters 622 filter and impedance buffer their respectively received phase voltage waveforms. Thereafter, each of the filtered and buffered phase voltage waveforms is provided to a separate channel of A/D converter 631 shown in FIG. 6E.

A/D converter 631 has three sample and hold (S/H) A/D converters (S/H converters), namely, S/H converters 632-633 shown in FIG. 6E and S/H converter 634 shown in FIG. 6F.

Each of the S/H converters 632-634 is capable of simultaneously determining six differential analog values and converting these analog values to a digital representation of these values. Each differential value is determined by the amplitude difference between two analog signals provided to the inputs of a channel of S/H converter 632-634. As each of S/H converters 632-634 has six individual channels, a combined total of eighteen differential analog values can be simultaneously determined and converted to digital representations by A/D converter 630.

Each of the twelve differential signal pairs provided by current monitoring interface 610 is provided to a separate channel of S/H converters 632 and 633. S/H converters 632 and 633 generate digital representations of the waveform differences existing at the pair of current taps for each of the twelve power circuits monitored.

S/H converter 634 receives each of the three phase voltage waveforms provided by voltage monitoring interface 620 at a separate channel and determines a difference between each phase voltage waveform and a reference waveform. The determined difference for each channel is converted to a digital representation that reflects the voltage detected at the corresponding phase tap.

More specifically, S/H converters 632 and 633 receive the filtered and impedance buffered differential signal pairs, representing the supply and return current waveforms, for each of the twelve power circuits interfaced to monitor/controller 212 by current monitoring interface 610. For each of their respective six channels, S/H converters 632 and 633 detect the analog amplitude difference between the channel's corresponding pair of differential signals and convert this difference to a digital value representing the difference. S/H converters 632 and 633 perform this detection and conversion process repeatedly so that the sequence of digital values produced for each channel provides a representation of the current flow through the corresponding power circuit.

Similarly, S/H converter 634 receives the filtered and impedance buffered phase voltage waveforms representing the voltage waveforms of the three-phase power line. S/H converter 634 detects the analog amplitude difference of each phase voltage waveform, with respect to a reference waveform, at a point in time and converts this amplitude difference to a digital representation of the difference. S/H converter 634 performs this detection and conversion process repeatedly so that the sequence of digital values produced for each channel provides a representation of the voltage waveform at the corresponding phase of the power line.

High voltage opto-isolator 640 receives and buffers the digital values produced by S/H converter 634 and communicates the buffered digital values as data to other components of monitor/controller 212, through optically-coupled data line drivers 642.

Figure 6G:
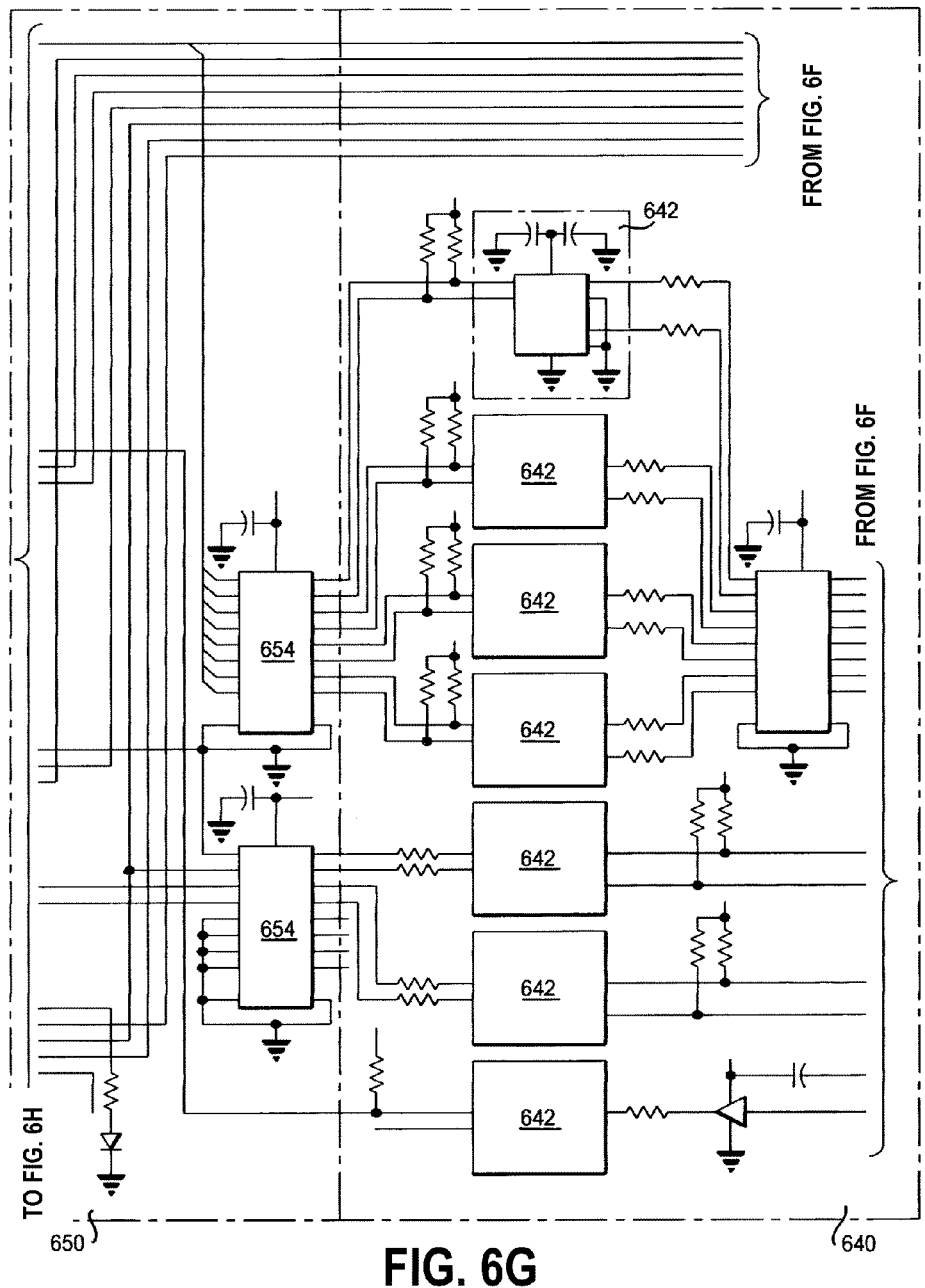
FIG. 6G illustrates an enlarged view of a high voltage opto-isolator and a portion of a data flow controller of the combination monitor-controller illustrated in FIG. 6A.

FIG. 6G illustrates an enlarged view of a portion 640 of the combination monitor-controller 212 illustrated in FIG. 6A including the high voltage opto-isolator and a portion of a data flow controller.

Figure 6H:
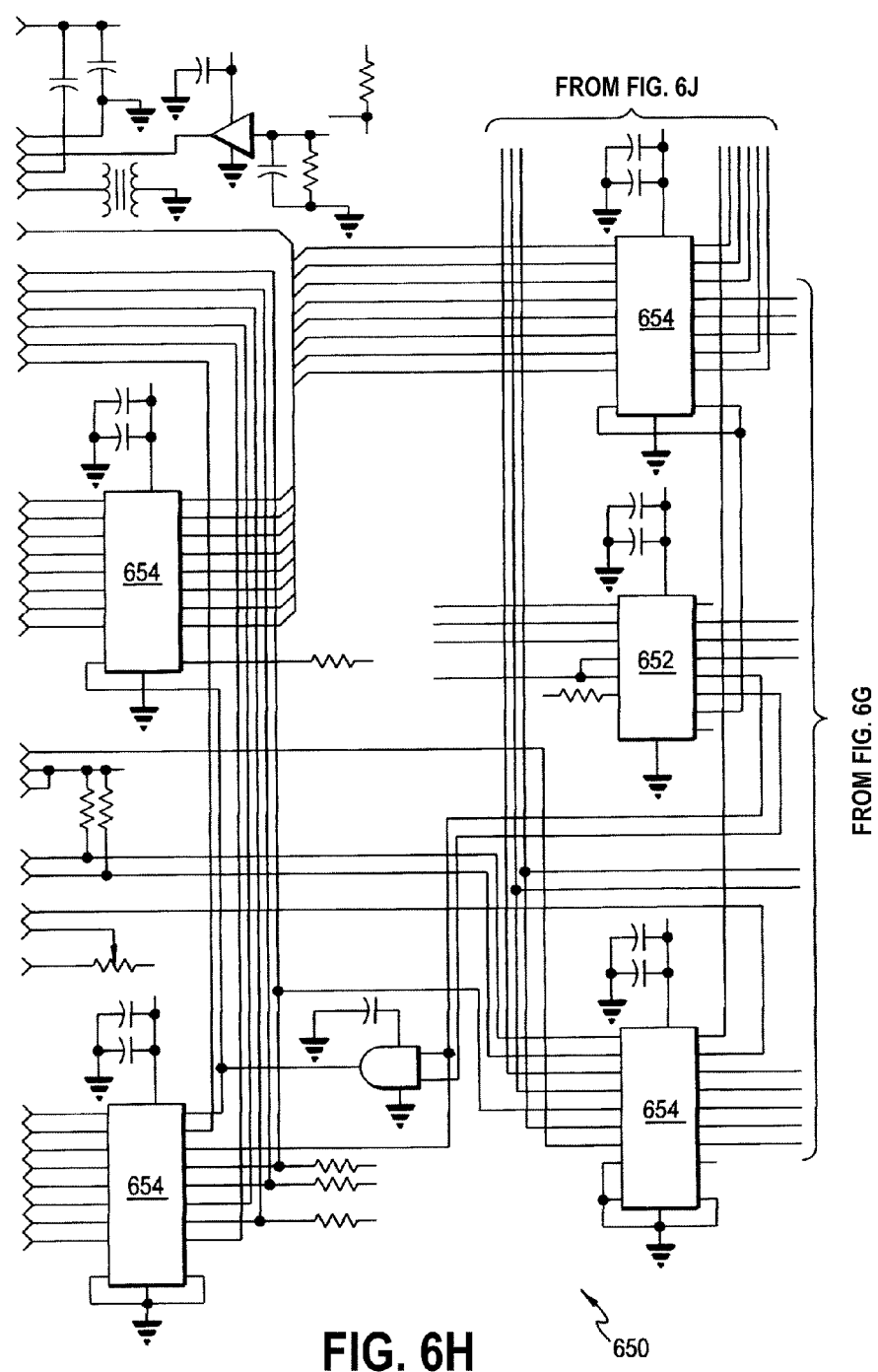
FIG. 6H illustrates an enlarged view of a portion of the data flow controller not illustrated in FIG. 6G.

FIG. 6H illustrates an enlarged view of a portion 650 of the data flow controller not illustrated in FIG. 6G. FIG. 6H illustrates an enlarged view another local interface 650 of the combination monitor-controller 212.

The electrical signal isolation provided by line drivers 642 (FIG. 6G) is desirable for electrically isolating monitor/controller 212's low-voltage components, which receive the digital data representing the phase voltage waveforms, from the components that may directly or indirectly receive the high voltage present at the phase taps of the high voltage (e.g., 480 VAC) power line.

The data flow controller controls the flow of specific data and control signals among the components of monitor/controller 212 and between these components and external devices. This control is provided by an address decoder 652 (FIG. 6H) and several bus buffers/line drivers 654 (FIGS. 6G and 6H).

Address decoder 652 decodes a three-bit encoded value provided by an address bus and selects one of eight prospective addresses identified by the encoded value. The selected address is communicated internally within monitor/controller 212 and externally, as necessary, to control the flow of specific data and control signals within monitor/controller 212. Bus buffers/line drivers 654 cooperate with address decoder 652 and other components of monitor/controller 212 to receive or transmit the specific data and control signals.

External devices (illustrated in FIG. 5) that communicate data or control signals to components of monitor/controller 212 may include a touchscreen device 517, a microprocessor 518, a communication modem 514, and environmental monitoring and control devices 511 516. The optional touchscreen device 517 displays specific data and control signals communicated through monitor/controller 212 and conveys user commands to monitor/controller 212. The microprocessor 518 provides the processing capability to determine operational characteristics of the monitored power line and each of the monitored power circuits, based on the data generated by A/D converter 630. Additionally, the microprocessor 518 provides general control and communication functionality for monitor/controller 212 and the external devices to which it is connected. The communication modem 514 supports communication between the microprocessor 518 and remotely located devices. The environmental monitoring and control devices 511 516 monitor and control environmental systems that may affect the operational characteristics of the power line or its associated power circuits.

Figure 6J:
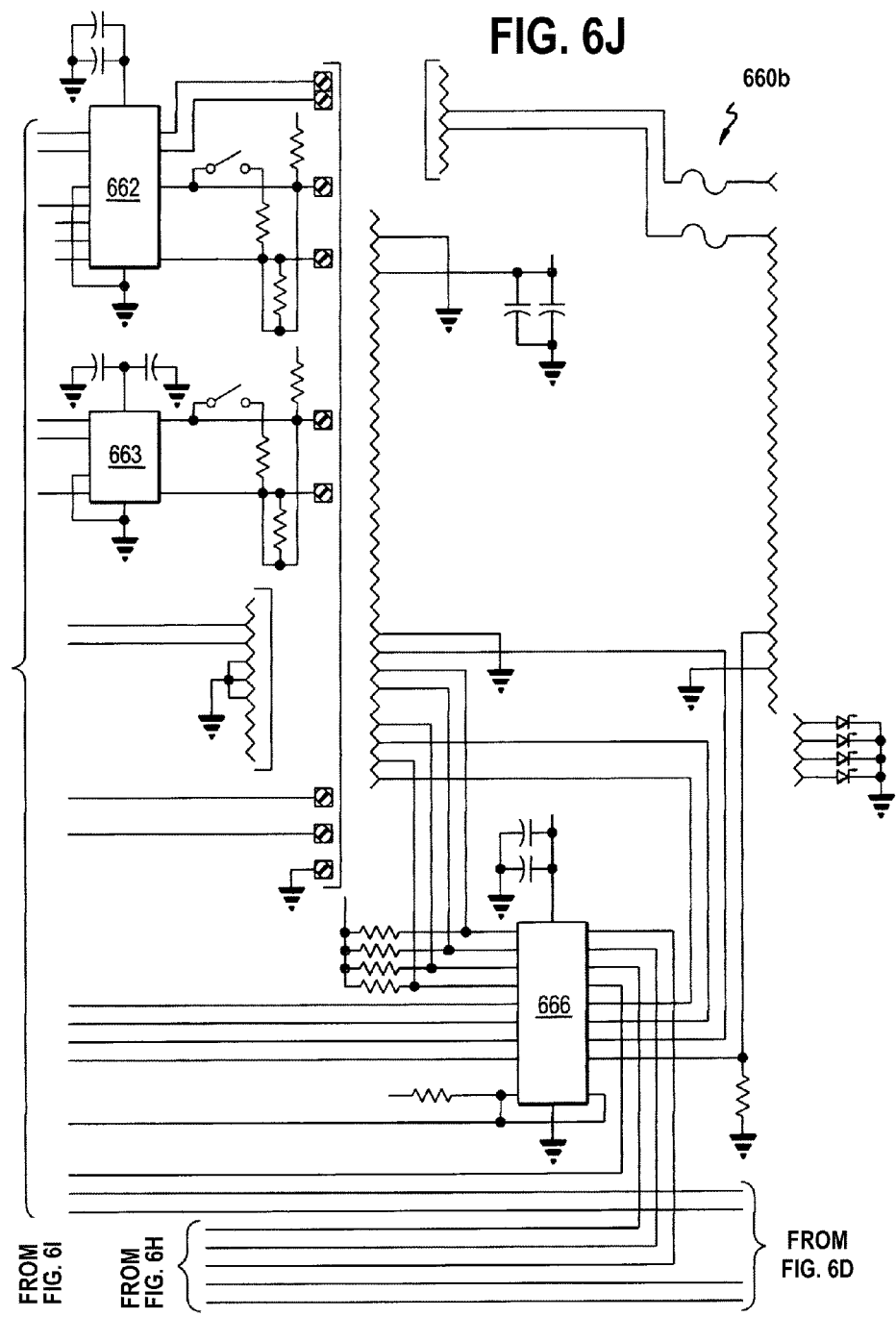

FIGS. 6I and 6J illustrate enlarged views of portions 660a and 660b of a remote communication interface 660 of the combination monitor-controller illustrated in FIG. 6A.

Remote communication interface 660 provides an interface for modem, RS-232, and RS-485 communications between external devices that are connected to monitor/controller 212. RS-485 transceivers 662 and 663 (FIG. 6J) receive and drive communication signals in accordance with RS-485 specifications. Similarly, RS-232 transceiver 664 (FIG. 6I) receives and drives communication signals in accordance with RS-232 specifications. Octal buffer/line drivers 665 (FIG. 6I) and 666 (FIG. 6J) buffer and drive specific data and control signals conveyed through communication section 660.

FIG. 6D(a) illustrates an enlarged view of a local control interface 670, and a direct current power supply 680 of the combination monitor-controller illustrated in FIG. 6A.

Local control interface 670 provides an opto-isolated communication interface between local environmental devices and monitor/controller 212. Local control interface 685 provides a 5 Vdc switched output to an external device and is preferably used to operate a display light of the touchscreen device 517.

Power supply 680 receives energy from an alternating current source and converts this energy for provision within monitor/controller 212 by regulated 5 Vdc and 3.3 Vdc sources.

FIG. 6K illustrates an enlarged view another local interface 675 of the combination monitor-controller illustrated in FIG. 6A. Local interface 675 communicates with portion 650 of the data flow controller.

In a preferred embodiment, the current inputs 202 are designed with instrumentation amplifiers. Full differential inputs are utilized to achieve the best signal conditions and noise rejection.

In a preferred embodiment, the potential inputs employ optical circuitry to provide high accuracy and isolation. The monitor/controller 212 accepts polyphase inputs including at least one of 120/277 volts (3 phase/4 wire) and 480 volts (3 phase/3 wire) 203. Single phase inputs to 480 volts 209 are acceptable.

In a preferred embodiment, the monitor/controller 212 comprises a plurality of digital inputs and outputs, serial ports and can be configured for a plurality of communication protocols. The plurality of serial ports further comprises at least two RS-485 ports and at least one RS-232 port. The plurality of protocols includes ModBus TCP/IP ASCII/RTU, 514

In an embodiment, the monitor/controller 212 manages HVAC and the at least one algorithm comprises "setback" scheduling 512. Environmental measurements 516 include trending temperatures through at least one of a thermostat and at least one wireless sensor. The at least one algorithm further provides demand control of a plurality of sub-loads. Wireless sensor measurements include ambient, freezer/cooler and HVAC duct temperatures. Monitoring and control variables 516 for HVAC include temperature and humidity. A persistent store 503 is provided for long term storage of measurements (e.g., load profiles) and optionally downloadable firmware/software executed by a microprocessor 518. In an alternative embodiment, the downloadable firmware is stored in a microprocessor 518. A listing of typical firmware/software is included in Appendix A. Typically, storage comprises at least one of SRAM and flash memory and at least 128 Kb of SRAM and 256 Kb of flash memory is provided.

In a preferred embodiment the monitor/controller 212 is configured to count pulses, sense contact status, and provide output alarming notification 513 on at least one input (predetermined and downloadable) threshold 512 and the at least one input threshold 512 can be reset from a remote location 205 206 using the at least one communication media 514. The communication media 514 provide the monitor/controller 212 with the ability to poll different devices 205, log data and transmit data to other systems under the direction of downloadable software that is executed by the monitor/controller 212 to capture data, e.g., as input to algorithms executed by the monitor/controller 212. The captured data is maintained on-board for extended periods of time in a persistent store 503 to provide historical load profile data and is remotely retrievable by other devices 205 and a facility manager/operator 206 using any of a plurality of included communication protocols 514.

In a preferred embodiment, referring now to FIG. 5, the monitor/controller 212 can be configured via an embedded Web server, or a PC/laptop running configuration software by a facility manager/operator 206 or by an inter-connected device 205. The configuration can be accomplished via local downloads via an at least one RS-232 port or remotely via downloads using a modem or network 514. Communication features 514 of the monitor/controller 212 include on-board Ethernet, embedded Web server, Embedded e-mail client, at least one serial data port, on-board modem, Modbus/485 and Modbus/IP, Xmodem file transfer.

In an embodiment, a local display that is preferably a touch screen 517 provides local viewing of at least one of energy data, waveforms, and configuration parameters.

The system and method of the present invention thus supports on-board advanced control algorithms for energy management, e.g., demand control, and provides interfaces to load control devices such as communicating thermostats.

Multi-Site Embodiment

In one aspect, referring again to FIGS. 3 and 5, an inter-connected embodiment (e.g., wide-area connectivity 207) of the present invention serves to permit remote management 512 of a plurality of monitor/controllers 212 and facilitates timely delivery of alarm/alert type reports 513.

Further, multiple-site connectivity allows at least one designated remote site to be designated a master site 212 and be able to retrieve data from many other sites 212 for centralized analysis and reporting (processing that requires more processing resources than practical to include at each site). The master site designation can be done dynamically and made dependent on conditions of the plurality of such sites, their usage of power, and any other pre-determined criteria.

Centralized analysis allows predictive/preventive maintenance. Centralized reporting provides operational data summaries for the many sites 212 within one report. WAN connectivity is only one example of the connectivity possible and is intended to aid discussion rather than limit the present invention. Among other possible connectivity modalities are wired and wireless networks including IEEE 802.11, LANs, and, depending on the distance between monitor/controllers, may include localized wireless networks such as Bluetooth. Any protocol can be supported since the procedures needed to accommodate a protocol can be downloaded to each affected monitor/controller 212 and therefore can be updated as needed. This flexibility to change and update the software/firmware executed by a monitor/controller 212 is a key distinguishing feature of the system and method of the present invention and contributes to robustness, longevity and applicability of the present invention to a broad spectrum of power management and control scenarios.

Figure 3:
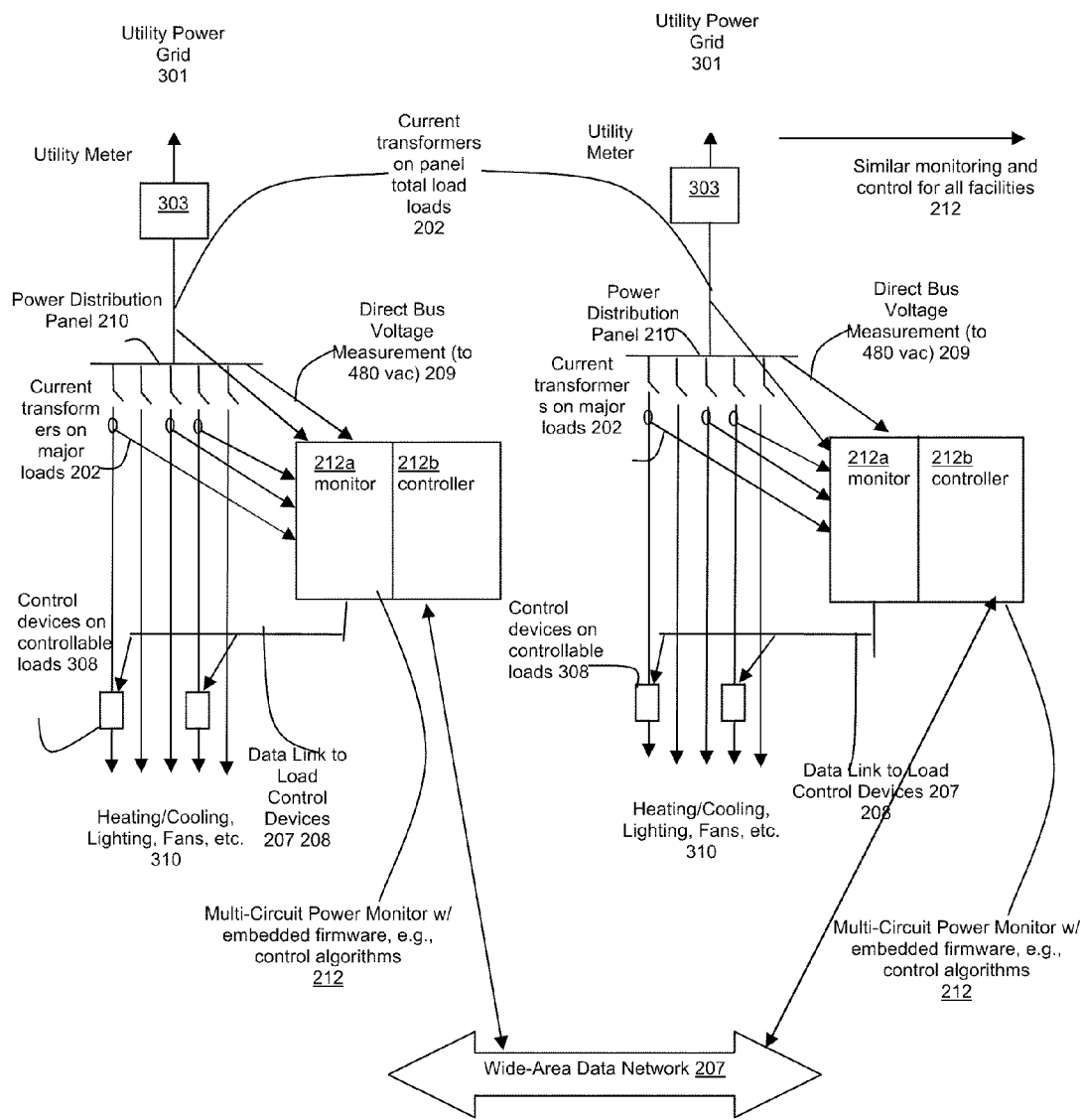
FIG. 3 illustrates multiple sites communicating with one another to accomplish management and control according to the present invention.

As illustrated in FIG. 3, a plurality of power distribution panels 210 each having at least one controllable load 308, are inter-connected by and coupled to a monitor/controller 212 to monitor and control major loads 202 and perform direct bus voltage measurements 209. As also illustrated in FIG. 3, each monitor/controller 212 comprises embedded firmware (including control algorithms) and are further each coupled to a data link 206 208 for inter-connectivity and centralized control/monitoring 207. Major loads 202 comprise controllable loads 308 and include at least devices such as heating/cooling devices, lighting, fans, humidifiers/dehumidifiers, and motors, compressors, production line drives.

In another aspect, the present invention employs at least one energy management strategy that further leverages having multiple sites 212 in an inter-connected system 207. For purposes of example and discussion only, in a wide area network, such a management strategy may include the following options:

(1) Using aggregated load data from total electrical load measurements at each monitored/controlled facility to negotiate with electric utility companies using the aggregated power grid 301 load instead of the many smaller constituent loads, i.e., to secure more favorable rates as a larger load customer; and (2) Using inter-connectivity 207 to curtail designated interruptible loads in each facility (such as pre-determined fraction of a facility's lighting) during periods of peak electrical demand on the utility power grid—thus taking advantage of lower electricity rates that may be associated with interruptible tariffs.

While availability of the foregoing strategies depends upon the particular electric utility serving the sites, and the "state" of electric power industry deregulation at a point in time, the system and method of the present invention includes flexible, e.g., downloadable over the inter-connectivity means 207, data gathering and control functions for accomplishing energy management strategies. In situations where option (1) above can be applied (getting the utility to accept and treat the aggregated impact of many small loads as a single large load), the system and method of the present invention then minimizes the peak demand of that single large load by "multiplexing" across sites 212 to significantly reduce energy cost—much like the multiplexing within a given site accomplished by a single monitor/controller 212 for local sub-loads.

Onboard Algorithms

The following algorithms comprise the embedded control algorithms of each power monitor and management device 212. These algorithms are presented for discussion only and not in any limiting sense. They are examples only of the types of embedded algorithms suited for monitoring and control but one skilled in the art will appreciate that the present invention is not limited to the following algorithm example discussions.

1. Waveform Sampling and Power Calculations

In a preferred embodiment, all voltage (×3) and current (×12 or ×33) waveforms are simultaneously and continuously sampled to collect and store a plurality of M samples (M typically is 64) over one full power grid sinusoidal waveform cycle (typically a time period of 16.67 milliseconds for a 60 Hz power system). Voltage waveforms are then additionally sampled to collect a total of N samples (N typically is 80) over one plus X sinusoidal waveform cycles (X typically is ¼). Various electrical power data values are then calculated using the previously collected samples as follows:

1.1 Calculated per cycle RMS (root mean squared) unscaled values:
        1.1.1. Voltage phase to neutral (×3)
        1.1.2. Voltage phase to phase (×3)
        1.1.3. Per phase load current (×12 or ×33)
        1.1.4. Per phase real power (watts—×12 or ×33)

1.1.5. Per phase reactive power (vars—×12 or ×33). Reactive power is calculated using voltage and current samples that are offset in time by the equivalent of 90 degrees phase angle, thus the need for additional voltage waveform samples (80 versus 64).

The above sampling and calculation process is repeated at least K times per second (K typically is 7), with the results of each repetition used to derive one second average values.

A one second average derived from the above per cycle RMS values are scaled to appropriate engineering units and used to further derive one second values for per phase apparent power (VA) and per phase power factor (PF), resulting in the following:

1.2 Calculated one second RMS scaled values:
   1.2.1 All above per cycle values
   1.2.2 Virtual load real power (virtual=summations of 1.1.4 above)
   1.2.3 Virtual load reactive power (summations of 1.1.5 above)
   1.2.4 Per phase and fixed three phase total load apparent power (VA)
   1.2.5 Per phase and fixed three phase total load power factor (PF)

Stored un-scaled waveform values (1.1 above) are also used to derive the following total harmonic distortion data:

1.3 Total Harmonic Distortion (THD) Values:
   1.3.1 Voltage phase to neutral (×3)
   1.3.2 Per phase load current (×12 or ×33)

One cycle THD values are derived for each of the above values approximately once every Y seconds (Y typically is 2).

2. Peak Electrical Demand Control

Electric power control routines are available to limit peak electrical demand (kw), including the following:

2.1 Evening Light Load Demand Control

This algorithm limits the total electrical demand for a facility by limiting the load associated with heating/cooling during evening periods when lighting load is significantly increased by the addition of parking lot and building signage lights. This algorithm is applicable to facilities where heating/cooling is handled by multiple individually controllable heating/cooling units—typically referred to as roof top units (RTUs), e.g., air conditioners, and any other type of electrical load that is suitable for control such as fans and motors.

For periods of time during which additional evening lighting is required, at least one RTU that has been identified as an at least one lowest priority unit (least critical to maintaining environmental comfort), is automatically switched off for the reminder of the evening lighting time period (7:00 PM to facility e.g., a predetermined interval of, say 15, 30, or 60 minutes, depending upon the specific utility tariff) is predicted to exceed the highest peak demand for any previous demand interval during that day, additional RTUs can be temporarily switched off for the remainder of each demand interval as required to keep the peak demand from exceeding the previous peak for that day. RTUs can be prioritized such that units of lesser importance are switched off first. Critical RTUs may not be included in the demand limiting control scheme.

2.2 RTU Multiplexing Demand Control

This algorithm is applicable to facilities where heating/cooling is handled by multiple individually controllable roof top units (RTUs), and can be used in conjunction with the algorithm of 2.1 above for evening light load demand control. This algorithm continuously limits the total electrical demand for a facility by coordinating the operation of all RTUs such that only a limited number of RTUs are drawing full load at any point in time, while allowing all RTUs to operate periodically. This is in contrast to multiplexing where each RTU would take its turn operating.

With this algorithm, RTUs can be grouped for time-shared operation (multiplexing). Each group is allowed to operate at normal setpoint targets for a limited period of time, followed by a period during which the setpoint target is significantly raised such that RTUs in this group do not draw full electrical load under normal conditions. Groups are coordinated in operation such that one group is operating at normal setpoint targets while other groups are operating with temporarily raised setpoints.

For example, consider a facility with six RTUs. With this control scheme, two RTUs might be identified as highly important to environmental comfort, and are allowed to always operate at the facility's target temperature for cooling, such as 74 degrees F. The other four RTUs are divided into two groups of two RTUs, referred to as Group 1 and Group 2. Each group alternates between 20 minute periods of operation at the normal setpoint of 74 degrees, and 20 minute periods of operation at a raised setpoint of 77 degrees. Group 1 operates normally while Group 2 operates at a raised setpoint, and then groups alternate setpoint positions. As a result, only four of six RTUs operate at full load at any moment in time.

This technique can be used to limit RTU operation in any combination that is determined to be appropriate for a given facility.

3. Solar Calculator for Lighting Control with Photo Sensor Override

This algorithm uses the geographical latitude and longitude of a facility to automatically calculate the sunrise and sunset time for a particular calendar day—to determine when external lighting should be switched on and off. Input from a photo sensor is also used to automatically turn lights on and off in response to unexpected darkness.

4. Instantaneous Power Derived From Energy Pulses

This algorithm measures the time duration between energy pulses (kwh) from traditional electric power meters to determine instantaneous power (kw). Instantaneous power values are needed for real time control algorithms such as the foregoing. This algorithm allows existing electric meters equipped with pulse outputs to be used in such control schemes, thus leveraging a facility's installed power management and control infrastructure.

5. Firmware Program Flow Description

The algorithms are part of the software/firmware that determines the operation of a monitor/controller 212 according to the present invention.

Figure 4B:
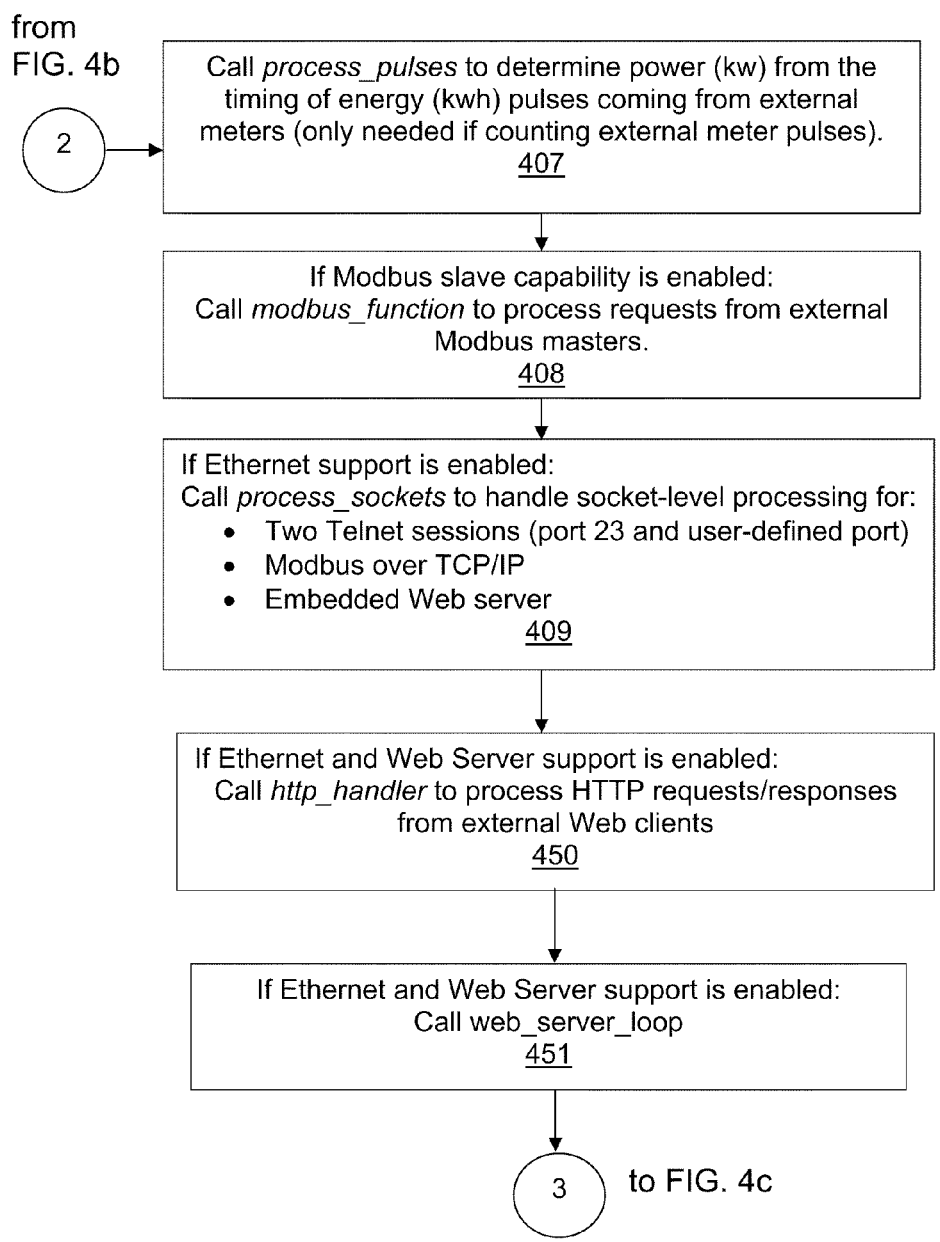

Referring now to FIGS. 4*a*, 4*b* and 4*c*, at the highest level, the firmware processing/logic flow is a main program loop [while (1) program loop within main( )] that executes continuously, except when execution is preempted by the following hardware-based interrupt service routines:

Periodically by hardware timer interrupt timerb_isr, which primarily handles analog to digital conversion processing at the chip level (read_ads7864 and read_sb)—reads and stores raw A/D values for processing by other routines.

Periodically by hardware timer interrupt app_timer_interrupt, which primarily handles the following processing:
     1. Modem ring detect
     2. Modbus protocol timer
     3. Lighting control protocol timer 4. Reading hardware status inputs
5. File transfer timer Asynchronously by various serial data port hardware interrupts to process incoming and outgoing characters on these ports.

6. Firmware Overview

Referring now to FIGS. 4a, 4b and 4c, an example of a downloaded software/firmware begins by initialized memory and hardware, including hardware interrupts at step 401. Once the processing is initialized at step 401, the process returns to step 402 at which the central ongoing housekeeping functions are performed:

the onboard heartbeat is toggled;
time-of-day events are handled as required, e.g., detecting changes in daylight savings time (DST) and making adjustments accordingly;
compensation is made for drift of the onboard clock;
modem and Modbus timers are processed; and
regularly scheduled e-mail reports are generated.

Next, at step 403 end-of-interval processing is accomplished, e.g., by calling the appropriate routines in a load profile library (lp.lib). Then, cycle data and per second scaled data is calculated by invoking routines in the adm7864 library at steps 404 and 405, respectively. Total harmonic distortion is calculated at step 406.

Next, power is determined from the timing of energy pulses coming from external meters (if any) at step 407, and any requests from ModBus external masters are processed at step 408.

Then, if Ethernet support is enabled socket-level processing is performed comprising for at least two Telnet sessions, Modbus over TCP/IP, and an embedded Web server at step 409. At step 450, if Web server support is also enabled, HTTP requests/responses are processed, and at step 451 web_server_loop is called to store new date and time values for use within web pages. If e-mail support is enabled then e-mail is processed at step 452. E-mail processing includes a) accessing the designated POP3 server to check for new incoming messages, b) interpreting the content of any new messages to queue up response report generation, c) building any e-mail reports that are queue up for processing, and d) accessing the designated SMTP server to send any reply messages that are ready for transmission.

At step 453, RS-232 port processing is performed to process incoming maintenance port request message strings, and prepare appropriate response message strings.

At step 454 any enabled modem support is performed. This support includes handling of modem connection and processing request and response message strings.

If there is a touch screen 517 it is services by calling lcdtick at step 455 to look for input from the touch screen (operator touch) and to update the touch screen graphical display 517 as necessary.

If there are thermostats being managed then they are serviced by calling Tstats at step 456 to read environmental variables and thermostat settings, and to update thermostat setpoints as dictated by various control algorithms.

Finally, any required lighting control support is performed by calling controlfunction within contol.lib at step 457 to turn on or off multiple lighting zones as dictated by various control algorithms.

The processing loops around to step 402, performing this loop of steps continuously unless interrupted by a higher priority task. After servicing the higher priority task, control is returned to the interrupted step until another higher priority task needs servicing by the processor.

Figure 9:
FIGS. 9 and 10 show photographs of an ADM-3311 Multi-Circuit Power Monitor, available from ADMMicro, LLC, Roanoke, Va., suitable for containing firmware according to the present invention.
Figure 10:
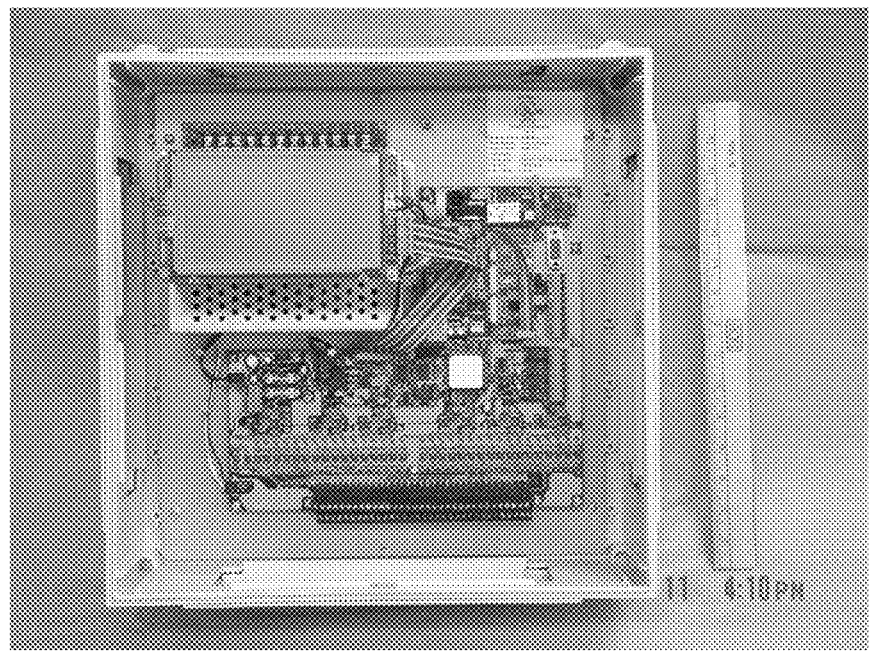

FIGS. 9 and 10 show photographs of an ADM-3311 Multi-Circuit Power Monitor, available from ADMMicro, LLC, Roanoke, Va., suitable for containing firmware according to the present invention.

Figure 11:
FIGS. 11 and 12 show photographs of an ADM-1204 Multi-Circuit Power Monitor, available from ADMMicro, LLC, Roanoke, Va., suitable for containing firmware according to the present invention.
Figure 12:
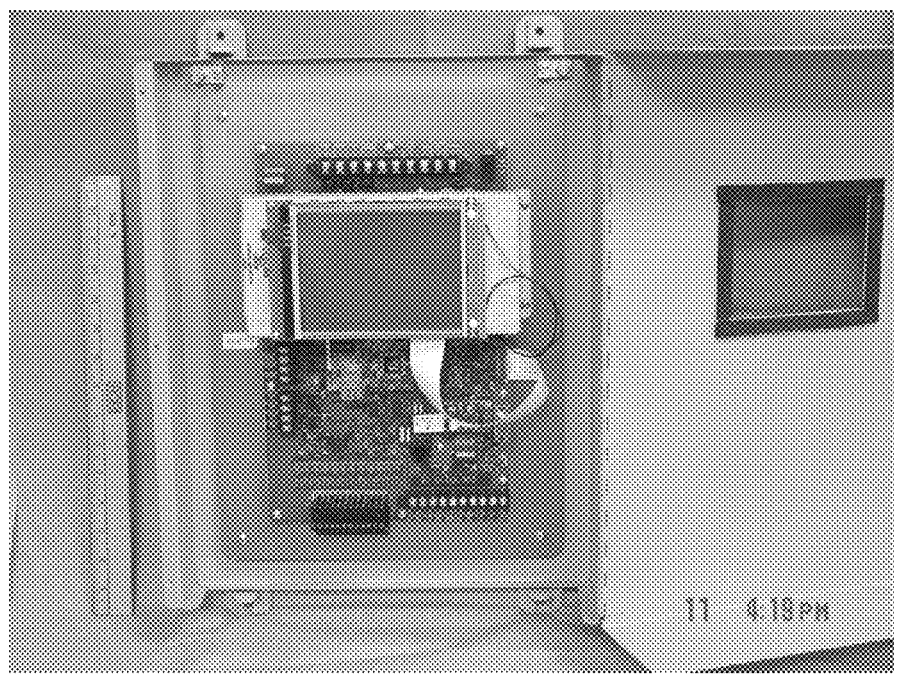

FIGS. 11 and 12 show photographs of an ADM-1204 Multi-Circuit Power Monitor, available from ADMMicro, LLC, Roanoke, Va., suitable for containing firmware according to the present invention.

While preferred embodiments have been shown and described, various modifications and substitutions may be made thereto without departing from the spirit and scope of the present invention. Accordingly, the present invention is limited to the scope of the appended claims, and the present invention has been described by way of illustrations and not limitations.

We claim:

1. A system for monitoring and controlling energy consumption, comprising:
a first component comprising a wide area network interface for communicating with a remote server;
a plurality of second components, each communicatively coupled with the first component, each second component comprising:
a plurality of input ports for receiving a plurality of voltage and current signals, including voltage and current signals from a single phase load and all phases of a poly-phase load,
an analog to digital converter for simultaneously sampling the received plurality of voltage and current signals from the single phase load and all phases of the poly-phase load and generating respective streams of digital values representative of the voltage and current signals of the single phase and poly-phase loads,
a processor configured for using the streams of digital values to concurrently monitor electrical energy consumption of a plurality of loads, including both the single phase load and the poly-phase load,
the configuration of the processor determined by configuration information, stored in that second component, originating from the remote server, and comprising load-definition data specifying which voltage signal(s) and current signal(s) are to be used in calculating energy consumption for each load to be monitored by that second component, wherein each of the second components is configured to transfer energy consumption data for their respectively monitored loads to the first component,
the first component further is configured to implement at least one load control algorithm, and
the first component is configured for centralized reporting of the energy consumption data from each of the second components, which can be accessed over the wide area network interface, and
the system is configured to implement a load monitoring algorithm comprising establishing a baseline load value associated with each monitored load and to indicate a fault in a circuit providing power to the monitored load if the monitored load deviates from the baseline load value by more than a threshold.

2. The system of claim 1, wherein the system further implements remote management of the first component and the plurality of second components.

3. The system of claim 1, wherein the system further implements alert reporting based on the transferred energy consumption data.

4. The system of claim 1, wherein the first component comprises input ports for receiving one or more signals indicative of at least one environmental variable, a configuration of the first component implementing the at least one load control algorithm using data for the least one environment variable as an input.

5. The system of claim 1, wherein the first component further locally stores information for baseline energy consumption values for one or more loads, the configuration further implementing the monitoring by periodically comparing load information with respective baseline values and indicating a fault if the comparison indicates deviation from its baseline value by more than a threshold.

6. The system of claim 1, wherein the first component and one of the second components form a module that implements both monitoring and control for the loads monitored by that second component.

7. The system of claim 1, wherein a baseline load value is determined at a time when a load is known to be performing at full capability.

8. The system of claim 1, wherein the system further implements alert reporting based on the transferred energy consumption data.

9. The system of claim 1, wherein the first component comprises input ports for receiving one or more signals indicative of at least one environmental variable, a configuration of the first component implementing the at least one load control algorithm using data for the least one environment variable as an input.

10. A system for monitoring and controlling energy consumption, comprising:
a first component comprising a wide area network interface for communicating with a remote server;
a second component communicatively coupled with the first component, comprising:
a plurality of input ports for receiving a plurality of voltage and current signals, including voltage and current signals from a single phase load and all phases of a poly-phase load,
an analog to digital converter for simultaneously sampling the received plurality of voltage and current signals from the single phase load and all phases of the poly-phase load and generating respective streams of digital values representative of the voltage and current signals of the single phase and poly-phase loads,
a processor configured for using the streams of digital values to concurrently monitor electrical energy consumption of a plurality of loads, including both the single phase load and the poly-phase load,
the configuration of the processor determined by configuration information, stored in the second component, originating from the remote server, and comprising load-definition data specifying which voltage signal(s) and current signal(s) are to be used in calculating energy consumption for each load to be monitored by the second component,
the second component is configured to transfer energy consumption data for the loads monitored by the second component to the first component,
the first component further is configured to implement at least one load control algorithm, and
the first component is configured for reporting the energy consumption data from the second component, which can be accessed over the wide area network interface, and
the system is configured to implement a load monitoring algorithm comprising establishing a baseline load value associated with each monitored load and to indicate a fault in a circuit providing power to the monitored load if the monitored load deviates from the baseline load value by more than a threshold.

11. The system of claim 10, wherein the system further implements remote management of the first component and the second component.

12. The system of claim 10, wherein the first component further locally stores information for baseline energy consumption values for one or more loads, the configuration further implementing the monitoring by periodically comparing load information with respective baseline values and indicating a fault if the comparison indicates deviation from its baseline value by more than a threshold.

13. The system of claim 10, wherein the first component and the second component form a module that implements both monitoring and control for the loads monitored by the second component.

14. The system of claim 10, wherein a baseline load value is determined at a time when a load is known to be performing at full capability.

* * * * *